(12) United States Patent
Hayashi et al.

(10) Patent No.: US 7,005,704 B2
(45) Date of Patent: Feb. 28, 2006

(54) INSULATED GATE DRIVE SEMICONDUCTOR DEVICE

(75) Inventors: Tetsuya Hayashi, Yokosuka (JP);
Masakatsu Hoshi, Yokohama (JP);
Saichirou Kaneko, Kyoto (JP);
Hideaki Tanaka, Yokosuka (JP)

(73) Assignee: Nissan Motor Co., Ltd., Kanagawa-Ken (JP)

( * ) Notice: Subject to any disclaimer, the term of this patent is extended or adjusted under 35 U.S.C. 154(b) by 21 days.

(21) Appl. No.: 10/860,130

(22) Filed: Jun. 4, 2004

(65) Prior Publication Data

US 2004/0251503 A1 Dec. 16, 2004

(30) Foreign Application Priority Data

Jun. 16, 2003 (JP) ............... P 2003-171095

(51) Int. Cl.
*H01L 29/76* (2006.01)
(52) U.S. Cl. ............ 257/342; 257/368; 257/371; 257/373
(58) Field of Classification Search ............. None
See application file for complete search history.

(56) References Cited

U.S. PATENT DOCUMENTS 5,444,273 A * 8/1995 Ueno ................. 257/138

FOREIGN PATENT DOCUMENTS

JP 10-233503 9/1998

* cited by examiner

*Primary Examiner*—Andy Huynh
(74) *Attorney, Agent, or Firm*—McDermott Will & Emery LLP

(57) ABSTRACT

An aspect of the present invention provides a semiconductor device includes that a drain region of a first conductivity type formed in a semiconductor substrate, a source region of the first conductivity type, an insulating film in contact with the source region, a gate electrode insulated from the source region by the insulating film, and a base region of a second conductivity type electrically connected to the gate electrode and in contact with the drain region, wherein majority carriers flow between the source region and the drain region before minority carriers are introduced from the base region into the drain region when a predetermined potential is applied to the gate electrode.

21 Claims, 12 Drawing Sheets n-Si    n-SiC n-Si    n-SiC

HETERO-SEMICONDUCTOR AREA 14    DRAIN AREA 2

ΔEc

OFF STATE

ON STATE

INSULATED GATE DRIVE SEMICONDUCTOR DEVICE

BACKGROUND OF THE INVENTION

The present invention relates to a semiconductor device, and particularly, to a technique for reducing ON resistance and increasing withstand voltage of a semiconductor device.

A related art as a background of the present invention is a standard MOSFET made of silicon carbide disclosed in, for example, Japanese Laid-Open Patent Publication No. Hei-10-233503 (Patent Reference 1).

FIG. 20 is a sectional view schematically showing the semiconductor device described in the Patent Reference 1. In FIG. 20, the semiconductor device has an $n^+$-type silicon carbide substrate region 51 and an $n^-$-type drain region 52 formed on the substrate region 51. At a part of the surface of the drain region 52, there are formed a p-type well region 53 and an $n^+$-type source region 54. On the drain region 52, there are arranged an insulating film 55 and a gate electrode 56. In contact with the well region 53 and source region 54, a source electrode 57 is formed. On a back face of the silicon carbide substrate region 51, a drain electrode 58 is formed.

Operation of the MOSFET will be explained. For example, the source electrode 57 is grounded, the drain electrode 58 is subjected to a positive potential, and the gate electrode 56 is grounded or is subjected to a negative potential. Then, the drain region 52 and well region 53 become a reversely biased state to put the semiconductor device in a nonconductive state.

When a proper positive potential is applied to the gate electrode 56, an inversion channel region is formed at an interface of the well region 53 adjacent to the gate electrode 56 through the insulating film 55. Then, electrons flow from the source region 54 to the drain region 52 through the channel region. In this way, the related art realizes a switching function.

SUMMARY OF THE INVENTION

The MOSFET of FIG. 20 is a majority carrier device based on electrons, and therefore, has a trade-off relationship between a withstand voltage and drift resistance, the withstand voltage being measured between the drain electrode 58 and the source electrode 57 in a nonconductive state, the drift resistance being measured in the drain region 52 in a conductive state. The trade-off relationship puts a limit to reduce the ON resistance of the semiconductor device.

In order to solve the problem of the related art, the present invention provides a semiconductor device capable of minimizing the trade-off relationship between a withstand voltage and ON resistance.

An aspect of the present invention provides a semiconductor device includes that a drain region of a first conductivity type formed in a semiconductor substrate, a source region of the first conductivity type, an insulating film in contact with the source region, a gate electrode insulated from the source region by the insulating films and a base region of a second conductivity type electrically connected to the gate electrode and in contact with the drain region, wherein majority carriers flowing between the source region and the drain region before minority carriers being introduced from the base region into the drain region when a predetermined potential is applied to the gate electrode.

The semiconductor device according to this aspect can introduce, in a conductive state, positive holes from the base region to the drain region to improve conductivity and reduce drift resistance, i.e., ON resistance compared with the prior art. In a nonconductive state, the semiconductor device can perform equivalently to the related art in terms of avalanche resistance and the like.

Here, a first conductivity type and a second conductivity type are opposite to each other. In other words, if the first conductivity type is an n-type, the second conductivity type is a p-type, and if the first conductivity type is a p-type, the second conductivity type is an n-type.

DETAILED DESCRIPTION OF EMBODIMENTS

Figure 1:
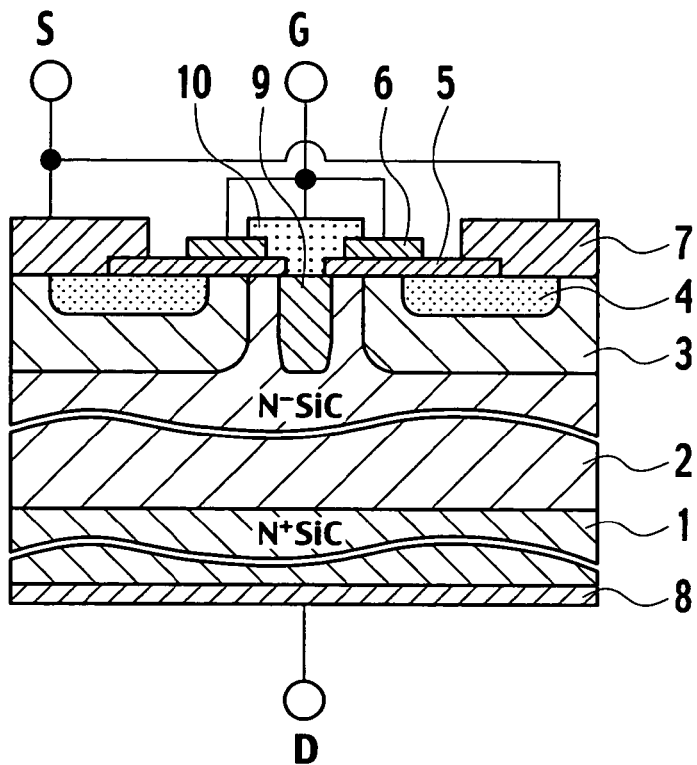
FIG. 1 is a sectional view showing a semiconductor device according to a first embodiment of the present invention, in which two structural unit cells face each other.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. The drawings are merely representative examples and do not limit the invention.

(First Embodiment)

FIG. 1 is a sectional view showing a semiconductor device according to a first embodiment of the present invention, in which two structural unit cells face each other. The semiconductor device according to this embodiment employs a silicon carbide substrate.

An $n^+$-type silicon carbide substrate region 1 has a silicon carbide polytype of, for example, 4H. On the substrate region 1, an $n^-$-type drain region 2 is formed. Opposite to a contact face between the drain region 2 and the substrate region 1; a p-type well region 3 is formed in contact with a principal plane of the drain region 2. An $n^+$-type source region 4 is formed in the well region 3. A gate electrode 6 is formed on an insulating film 5 adjacent to the drain region 2, well region 3, and source region 4.

The gate electrode 6 is made of conductive material such as metal or polysilicon. According to this embodiment, the gate electrode 6 is made of polysilicon as an example. A source electrode 7 is formed in contact with the well region 3 and source region 4. A drain electrode 8 is formed in contact with the silicon carbide substrate region 1.

According to the embodiment, a p-type base region 9 is formed in the drain region 2 between well regions 3 that face each other. The base region 9 is in contact with a base electrode 10, which is in contact with the gate electrode 6. In FIG. 1, the depth of the base region 9 is equivalent to the depth of the well region 3. Instead, the base region 9 may be shallower or deeper than the well region 3.

Figure 20:
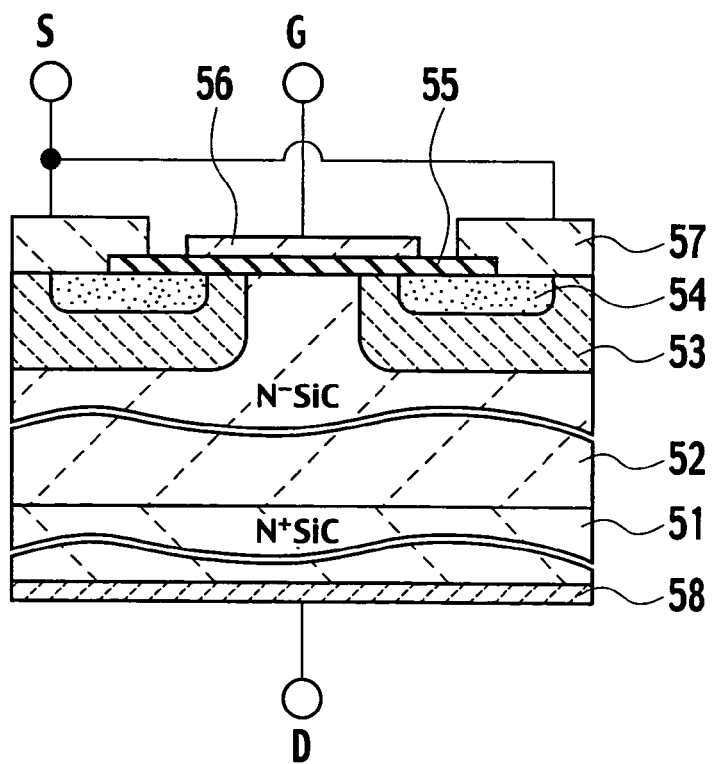
FIG. 20 is a sectional view schematically showing the semiconductor device described in the Patent Reference 1.

If the base region 9 and well region 3 are formed to the same depth in the same manufacturing process, the manufacturing process of the related art of FIG. 20 is applicable to manufacture the base region 9 and well region 3 of the embodiment In FIG. 1, the base electrode 10 and gate electrode 6 are connected to each other on the base region 9. Instead, the base electrode 10 and gate electrode 6 may be connected to each other at a location other than above the base region 9.

Operation of the semiconductor device according to the first embodiment will be explained. For example, the source electrode 7 is grounded and a positive potential is applied to the drain electrode 8.

When the gate electrode 6 is applied with a ground potential or a negative potential, the semiconductor device keeps a nonconductive state. Namely, a pn junction between the well region 3 and the drain region 2 is put in a reversely biased state. Since the base electrode 10 is applied with the ground potential or negative potential, a pn junction between the base region 9 and the drain region 2 is also put in a reversely biased state. From each of the pn junctions, a depletion layer grows into the $n^-$-type drain region 2 provided with a reduced impurity concentration to realize high resistance.

At this time, according to the related art of FIG. 20, the distance between the facing well regions 53 must be narrowed as small as possible to prevent the insulating film 55 from being exposed to a high electric field. However, the drain region 52 between the well regions 53 serves as a current path during a conductive state, and narrowing the distance between the well regions 53 increases resistance, i.e., so-called JFET resistance at the part. The related art, therefore, must consider the trade-off relationship between the distance and the JFET resistance between the facing well regions 53.

On the other hand, the first embodiment can block a built-in electric field extending from the well region 3 during a conductive state as mentioned below. Accordingly, the embodiment can easily narrow the distance between the well region 3 and the base region 9. Namely, in a nonconductive state, depletion layers spread from both the well region 3 and base region 9 into the drain region 2 adjacent to the insulating film 5. When these depletion layers join together, they relax drain electric fields reaching the insulating film 5, to improve the insulation reliability of the insulating film 5.

Next, when a predetermined positive potential is applied to the gate electrode 6, the nonconductive state shifts to a conductive state. According to the embodiment, a gate threshold potential at which electrons start to flow between the source region 4 and the drain region 2 is equal to or lower than a built-in potential at the pn junction between the base region 9 and the drain region 2.

A concrete example of this will be explained. The silicon carbide base region 9 and drain region 2 form a pn junction having a built-in potential of, for example, about 2 V. In this case, the gate threshold voltage is designed to be about 2 V or smaller. If the base region 9 and drain region 2 are made of silicon and if the built-in potential of the pn junction thereof is about 0.7 V, the gate threshold potential is designed to be about 0.7 V or smaller. In this way, the embodiment forms the base region 9 and drain region 2 from wide-gap semiconductor such as silicon carbide, to easily set the gate threshold voltage.

When the positive potential applied to the gate electrode 6 reaches the gate threshold potential, an inversion layer is formed at an interface between the well region 3 and the insulating film 5, and electrons start to flow from the source region 4 to the drain region 2. At this time, the same positive potential is applied to the base region 9, to relax a built-in electric field spreading from the base region 9 and well region 3 to the drain region 2.

When the positive potential applied to the gate electrode 6 reaches the built-in potential of the pn junction, positive holes are introduced from the base region 9 into the drain region 2. Then, the built-in electric field extending from the base region 9 and well region 3 to the drain region 2 is completely blocked. At the same time, the conductivity of the drain region 2 provided with a reduced impurity concentration to realize high resistance rises, so that electrons flowing from the source region 4 to the drain region 2 may encounter low resistance.

At this time, the related art of FIG. 20 is a majority carrier device with no positive holes introduced into the drain region 52, and therefore, there is the trade-off relationship between a withstand voltage in a nonconductive state and drift resistance in the drain region 52 in a conductive state.

On the other hand, the embodiment of the present invention can increase conductivity by introducing positive holes from the base region 9 into the drain region 2. Accordingly, the embodiment can secure a predetermined withstand voltage for a nonconductive state by reducing the impurity concentration of the drain region 2 and by thinning the drain region 2 without increasing the drift resistance of the drain region 2. Namely, with the same withstand voltage as the related art, the embodiment can further decrease the drift resistance.

Next, if a ground potential or a negative potential is applied to the gate electrode 6, the conductive state shifts to a nonconductive state. The positive holes introduced in the drain region 2 move to the base region 9. Namely, the positive holes in the drain region 2 are gradually depleted. During this period, the potential of the gate electrode 6 is maintained at the built-in potential between the base region 9 and the drain region 2. Namely, electrons flowing from the source region 4 to the drain region 2 are maintained. When the positive holes introduced in the drain region 2 are depleted, the potential of the gate electrode 6 drops to the gate threshold potential, and the inversion layer formed at the interface of the insulating film 5 retracts to stop the electrons flowing from the source region 4 to the drain region 2.

In this way, this embodiment establishes a predetermined potential difference between, for example, the built-in potential of a pn junction and a gate threshold potential, so that the semiconductor device may operate as a majority carrier device like the related art just before disconnecting the source region 4 and drain region 2 from each other. Namely, unlike a bipolar transistor representative of a minority carrier injection device, the embodiment forms a predetermined potential difference between a potential to draw positive holes and a potential to stop electrons, to thereby prevent a secondary breakdown specific to the bipolar transistor and realize the same performance as the majority carrier device in terms of avalanche resistance and the like.

As explained above, this embodiment introduces, in a conductive state, positive holes from the base region 9 into the drain region 2 to increase conductivity and reduce drift resistance. At the time of disconnection, the embodiment performs like a majority carrier device in terms of avalanche resistance and the like. In addition, the embodiment can easily improve the insulation reliability of the insulating film 5. The base region 9 is manufacturable with the well region 3 to the same depth, and therefore, the semiconductor device of the first embodiment is manufacturable through the manufacturing processes of the related art.

The base region 9 is in contact with the insulating film 5, and therefore, can block a drain electric field from reaching the insulating film 5 at the time of disconnection, to improve the insulation reliability of the insulating film 5.

The semiconductor substrate of the first embodiment is made of wide-gap semiconductor, and therefore, a built-in potential difference at a pn junction is higher that that of silicon, to easily secure a potential difference relative to a gate threshold potential.

According to the first embodiment, the gate threshold potential is designed to be smaller than the built-in potential of a pn junction to realize the above-mentioned effect. Instead, an external resistor may be connected between, for example, the base electrode 10 and the gate electrode 6. In this case, positive holes are introduced from the base region 9 into the drain region 2, and when a gate potential is increased, electrons flow between the source region 4 and the drain region 2. To secure gate driving efficiency under a predetermined positive potential, a current value from the base region 9 to the drain region 2 must be one tenth or smaller of a current value between the source region 4 and the drain region 2.

(Second Embodiment)

Figure 2:
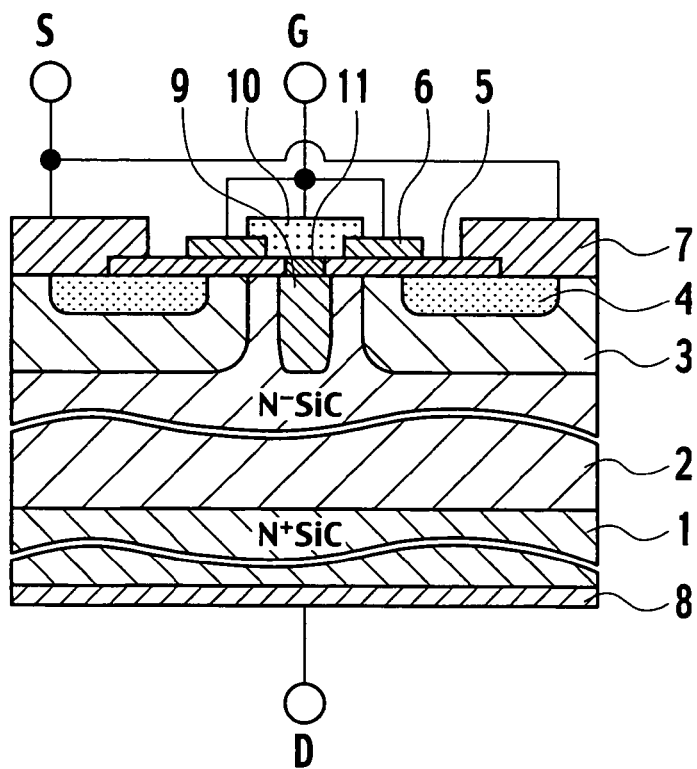
FIG. 2 is a sectional view showing a semiconductor device according to a second embodiment of the present invention and corresponds to FIG. 1 of the first embodiment.

FIG. 2 is a sectional view showing a semiconductor device according to a second embodiment of the present invention and corresponds to FIG. 1 of the first embodiment. Parts of the second embodiment that operate like those of the first embodiment will not be explained again, and parts characteristic to the second embodiment will be explained in detail.

In addition to the structure of the first embodiment, the second embodiment of FIG. 2 has a Schottky region 11 between a base region 9 and a gate electrode 6, to form a Schottky junction with the base region 9. Namely, between the p-type base region 9 and the Schottky region 11, there is a Schottky diode to pass a forward current when the base region 9 is at a predetermined positive potential.

Operation of the semiconductor device according to the second embodiment will be explained. Like the first embodiment, a source electrode 7 is grounded and a positive potential is applied to a drain electrode 8.

First, a ground potential or a negative potential is applied to the gate electrode 6, and a nonconductive state is maintained like the first embodiment. Namely, a forward bias is applied to the Schottky diode between the base region 9 and the Schottky region 11. At this time, a reverse bias is applied to a pn junction between the base region 9 and a drain region 2 similar to a pn junction between a well region 3 and the drain region 2. As a result, a depletion layer expands from each pn junction into the n⁻-type drain region 2 provided with a reduced impurity concentration to realize high resistance.

Next, a predetermined positive potential is applied to the gate electrode 6 to shift the nonconductive state to a conductive state like the first embodiment. At this time, according to the second embodiment, a reverse bias is applied to the Schottky diode between the base region 9 and the Schottky region 11. As a result, no positive holes are introduced from the base region 9 into the drain region 2 until the sum of a built-in potential at the pn junction between the base region 9 and the drain region 2 and a reversely biased potential at which the Schottky diode causes an avalanche breakdown is applied to the gate electrode 6.

A concrete example of this will be explained. The pn junction between the silicon carbide base region 9 and drain region 2 is, for example, about 2 V, and the reversely biased potential at which the Schottky diode causes an avalanche breakdown is, for example, 13 V. Then, the potential to start introducing positive holes from the base region 9 into the drain region 2 is about 15 V.

In this way, this embodiment sets a predetermined potential at which the Schottky diode formed between the base region 9 and Schottky region 11 causes an avalanche breakdown, to thereby freely determine a potential of the gate electrode 6 at which positive holes are introduced from the base region 9 into the drain region 2. Compared with the first embodiment, the second embodiment can secure a sufficient potential difference relative to a gate threshold potential at which electrons start to flow from the source region 4 to the drain region 2. Accordingly, the second embodiment can form a sufficient inversion layer at an interface between the well region 3 and the insulating film 5. This results in reducing channel resistance of the inversion layer to further reduce ON resistance compared with the first embodiment.

Thereafter, a ground potential or a negative potential is applied to the gate electrode 6 to shift the conductive state to a nonconductive state. According to the second embodiment, there is a sufficient potential difference between the potential of the gate electrode 6 at which positive holes are drawn from the drain region 2 to the base region 9 and the gate threshold potential at which the source region 4 is disconnected from the drain region 2. Accordingly, the semiconductor device of the second embodiment operates like a majority carrier device just before the source region 4 and drain region 2 are disconnected from each other. Compared with the first embodiment, the second embodiment can easily operate like a majority carrier device in terms of avalanche resistance and the like.

As mentioned above, the second embodiment can freely set a potential to start introducing positive holes from the base region 9 into the drain region 2. The second embodiment can secure a predetermined potential difference relative to a gate threshold potential and reserve a sufficient electron path in a channel. Namely, the second embodiment can reduce channel resistance and further decrease ON resistance. In a nonconductive state, the second embodiment can easily function like a majority carrier device in terms of avalanche resistance and the like.

Compared with the first embodiment, the second embodiment can reduce channel resistance in an inversion layer to further decrease ON resistance. Compared with the first embodiment, the second embodiment can easily operate like a majority carrier device in terms of avalanche resistance and the like. Compared with the first embodiment, the second embodiment hardly causes current concentration, is resistive against a thermal breakdown, and is appropriate for a parallel arrangement.

(Third embodiment)

Figure 3:
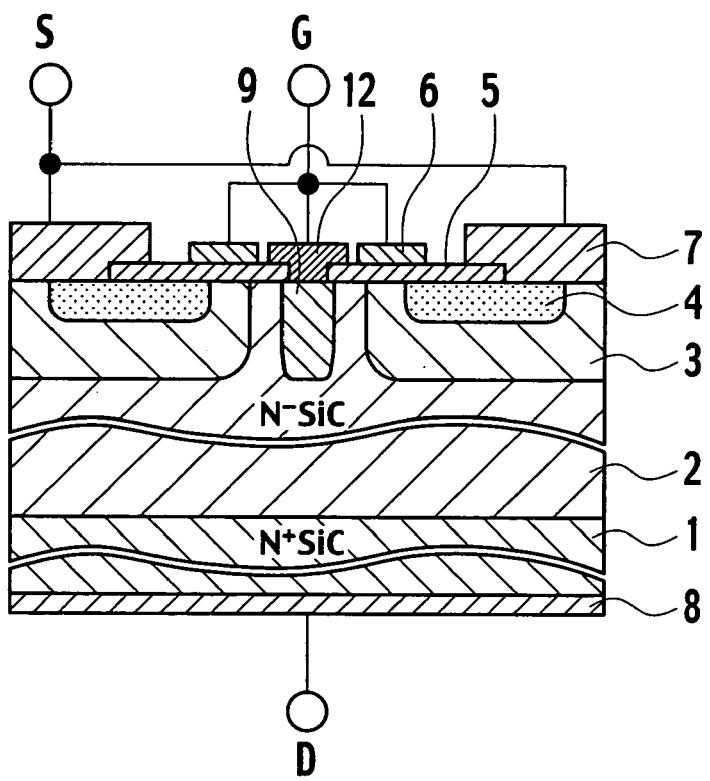
FIG. 3 is a sectional view showing a semiconductor device according to a third embodiment of the present invention and corresponds to FIG. 1 of the first embodiment

FIG. 3 is a sectional view showing a semiconductor device according to a third embodiment of the present invention and corresponds to FIG. 1 of the first embodiment. Parts of the third embodiment that operate like those of the first embodiment will not be explained again, and parts characteristic to the third embodiment will be explained in detail.

In FIG. 3, the third embodiment forms a zener region 12 made of, for example, n-type polysilicon between a base region 9 and a base electrode 10. Namely, a junction between the base region 9 and the zener region 12 is a heterojunction of silicon carbide and polysilicon having different band gaps. At a junction interface, there is an energy barrier. Namely, between the p-type base region 9 and the zener region 12, there is formed a heterodiode to pass a forward current when the p-type base region 9 is at a positive potential.

Figure 4:
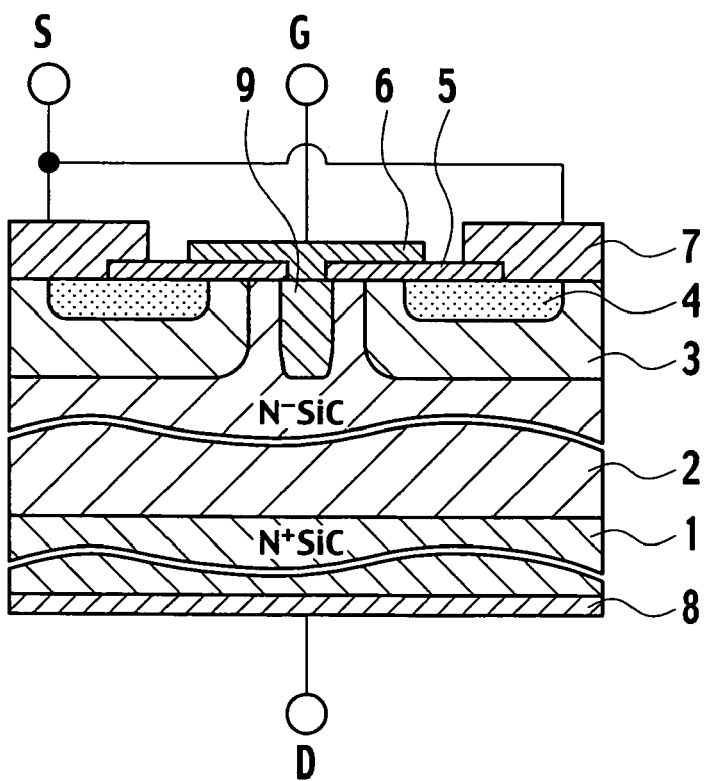
FIG. 4 is a sectional view showing a semiconductor device that the zener region 12 and gate electrode 6 are integrated into one according to the third embodiment.

The third embodiment forms the zener region 12 and gate electrode 6 from similar materials, and therefore, the zener region 12 and gate electrode 6 can be formed in the same manufacturing process. The zener region 12 and gate electrode 6 may be integrated into one as shown in FIG. 4. In this case, there is no need of fine patterning when forming the gate electrode 6 and zener region 12.

Next, operation of the third embodiment will be explained. For example, a source electrode 7 is grounded, and a positive potential is applied to a drain electrode 8.

First, a ground potential or a negative potential is applied to the gate electrode 6 to maintain a nonconductive state like the first embodiment. Namely, a pn junction between a well region 3 and a drain region 2 is set in a reversely biased state. Also, a pn junction between the base region 9 and the drain region 2 is set in a reversely biased state although there is a potential drop corresponding to a forward built-in potential of the heterodiode between the base region 9 and the zener region 12. As a result, a depletion layer expands from each junction into the n$^-$-type drain region 2 provided with a reduced impurity concentration to realize high resistance.

Next, a predetermined positive potential is applied to the gate electrode 6 to shift the nonconductive state to a conductive state. According to this embodiment, applying the predetermined positive potential to the gate electrode 6 results in applying a reverse bias to the heterodiode between the base region 9 and the zener region 12.

This means that positive holes are introduced from the base region 9 into the drain region 2 only when the sum of a built-in potential between the base region 9 and the drain region 2 and a potential to cause an avalanche breakdown between the base region 9 and the zener region 12 is applied to the gate electrode 6.

For example, the built-in potential between the silicon carbide base region 9 and drain region 2 is 2V, and the avalanche breakdown voltage of the heterodiode between the base region 9 and the zener region 12 is 13 V. Then, a voltage to be applied to the gate electrode 6 to introduce positive holes into the drain region 2 is about 15 V.

Namely, the potential to introduce positive holes from the base region 9 into the drain region 2 can freely be set by changing the avalanche breakdown voltage of the heterodiode formed between the base region 9 and the zener region 12. Compared with the first embodiment, the third embodiment can secure a sufficient difference relative to a gate threshold potential between the source region 4 and the drain region 2 and form a sufficient inversion layer at an interface between the well region 3 and an insulating film 5. Namely, the third embodiment can reduce channel resistance in the inversion layer to further decrease ON resistance compared with the first embodiment.

Thereafter, a ground potential or a negative potential is applied to the gate electrode 6 to shift the conductive state to a nonconductive state. According to the third embodiment, there is a sufficient potential difference between a potential of the gate electrode 6 at which positive holes are drawn from the drain region 2 to the base region 9 and the gate threshold potential at which the source region 4 is disconnected from the drain region 2. Accordingly, the semiconductor device of the third embodiment operates like a majority carrier device just before the source region 4 and drain region 2 are disconnected from each other.

Compared with the first embodiment, the third embodiment can easily function like a majority carrier device in terms of avalanche resistance and the like.

Compared with the first embodiment, the third embodiment can further reduce channel resistance in an inversion layer to decrease ON resistance like the second embodiment. Compared with the first embodiment, the third embodiment can easily operate like a majority carrier device in terms of avalanche resistance and the like. Compared with the first embodiment, the third embodiment hardly causes current concentration, is resistive against a thermal breakdown, and is appropriate for a parallel arrangement.

Compared with the second embodiment, the third embodiment forms the zener region 12 from a material similar to the material of the gate electrode 6, and therefore, the zener region 12 and gate electrode 6 can be formed in the same manufacturing process. The zener region 12 and gate electrode 6 can be integrated into one as shown in FIG. 4. In this case, there is no need of fine patterning when forming the gate electrode 6 and zener region 12.

The semiconductor device according to the third embodiment can freely set a potential to start introducing positive holes from the base region 9 into the drain region 2. As a result, the third embodiment can secure a predetermined potential difference relative to a gate threshold potential and reserve a sufficient electron path in a channel. Namely, the third embodiment can reduce channel resistance and further decrease ON resistance. In a nonconductive state, the third embodiment can easily operate like a majority carrier device in terms of avalanche resistance and the like. By changing the concentration and conductivity type of the zener region 12, the third embodiment can freely set the forward and reverse characteristics of the heterojunction, to increase the degree of designing freedom of the semiconductor device.

The third embodiment can simplify manufacturing processes. The zener region 12 and gate electrode 6 can be integrated into one, to eliminate fine patterning when forming the gate electrode 6 and zener region 12.

The semiconductor device of the third embodiment is manufacturable with the use of a silicon process which is easy to carry out.

(Fourth Embodiment)

Figure 5:
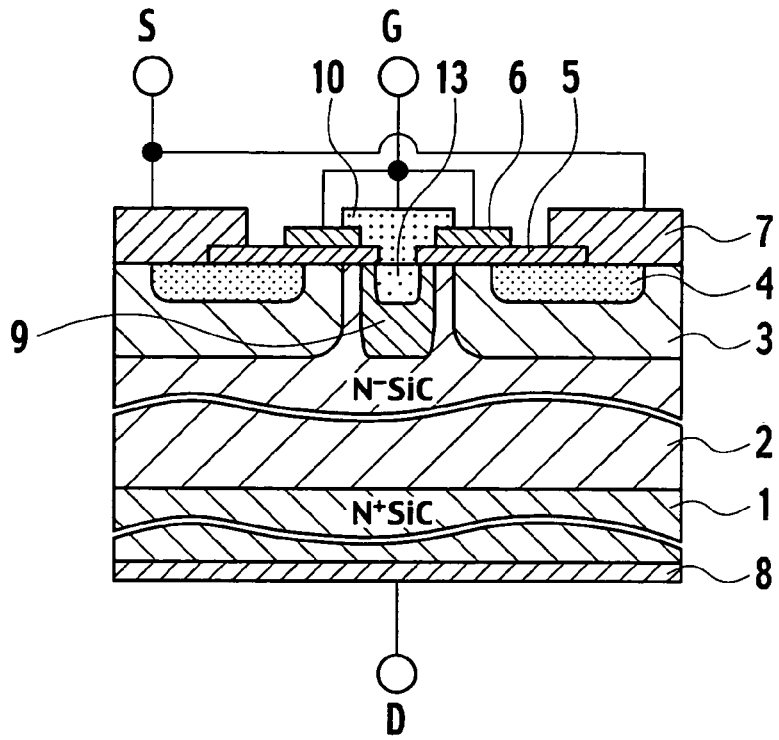
FIG. 5 is a sectional view showing a semiconductor device according to a fourth embodiment of the present invention and corresponds to FIG. 1 of the first embodiment.

FIG. 5 is a sectional view showing a semiconductor device according to a fourth embodiment of the present invention and corresponds to FIG. 1 of the first embodiment. Parts of the fourth embodiment that operate like those of the first embodiment will not be explained again, and parts characteristic to the fourth embodiment will be explained in detail.

In FIG. 5, the fourth embodiment forms an n-type diffusion region 13 in a base region 9 and connects the diffusion region 13 to a base electrode 10. Namely, between the p-type base region 9 and the n-type diffusion region 13, there is a pn junction diode that passes a forward current when the p-type base region 9 is at a positive potential.

According to the fourth embodiment, the diffusion region 13 can be formed in the same manufacturing process for forming a source region 4.

Operation of the fourth embodiment will be explained. For example, a source electrode 7 is grounded, and a positive potential is applied to a drain electrode 8.

First, a ground potential or a negative potential is applied to the gate electrode 6 to maintain a nonconductive state like the first embodiment. Namely, a pn junction between a well region 3 and a drain region 2 is set in a reversely biased state. Also, a pn junction between the base region 9 and the drain region 2 is set in a reversely biased state although there is a potential drop corresponding to a forward built-in potential of the pn junction diode formed between the base region 9 and the diffusion region 13. As a result, a depletion layer expands from each junction into the $n^-$-type drain region 2 provided with a reduced impurity concentration to realize high resistance.

Next, a predetermined positive potential is applied to the gate electrode 6 to shift the nonconductive state to a conductive state. According to this embodiment, applying the predetermined positive potential to the gate electrode 6 results in applying a reverse bias to the pn junction diode between the base region 9 and the diffusion region 13.

This means that positive holes are introduced from the base region 9 into the drain region 2 only when the sum of a built-in potential between the base region 9 and the drain region 2 and a potential to cause an avalanche breakdown between the base region 9 and the diffusion region 13 is applied to the gate electrode 6. For example, the built-in potential between the silicon carbide base region 9 and drain region 2 is 2V, and the avalanche breakdown voltage of the pn junction diode between the base region 9 and the diffusion region 13 is 13 V. Then, a voltage to be applied to the gate electrode 6 to introduce positive holes into the drain region 2 is about 15 V.

Namely, the potential to introduce positive holes from the base region 9 into the drain region 2 can freely be set by changing the avalanche breakdown voltage of the pn junction diode formed between the base region 9 and the diffusion region 13. Compared with the first embodiment, the fourth embodiment can secure a sufficient difference relative to a gate threshold potential between the source region 4 and the drain region 2 and form a sufficient inversion layer at an interface between the well region 3 and an insulating film 5. Namely, the fourth embodiment can reduce channel resistance in the inversion layer to further decrease ON resistance compared with the first embodiment.

The avalanche breakdown voltage of the pn junction diode between the base region 9 and the diffusion region 13 increases as temperature rises. When the temperature of the semiconductor device of FIG. 5 increases, positive holes introduced from the base region 9 into the drain region 2 are limited.

Namely, if a plurality of the structural unit cells shown FIG. 5 are arranged in parallel lines to form a semiconductor chip, there will be temperature differences among the structural unit cells. In this case, the structural unit cells of high temperatures increase the resistance thereof, to limit electrons flowing between the source regions 4 and the drain regions 2. The semiconductor device according to the fourth embodiment, therefore, hardly causes current concentration and resistive against a thermal breakdown. According to the fourth embodiment, it is easy to connect the structural unit cells in parallel.

Next, a ground potential or a negative potential is applied to the gate electrode 6 to shift the conductive state to a nonconductive state. According to the fourth embodiment, there is a sufficient potential difference between a potential of the gate electrode 6 at which positive holes are drawn from the drain region 2 to the base region 9 and the gate threshold potential at which the source region 4 is disconnected from the drain region 2. Accordingly, the semiconductor device of the fourth embodiment operates like a majority carrier device just before the source region 4 and drain region 2 are disconnected from each other. Compared with the first embodiment, the fourth embodiment can easily operate like a majority carrier device in terms of avalanche resistance and the like.

Compared with the first embodiment, the fourth embodiment can further reduce channel resistance in an inversion layer to decrease ON resistance like the second embodiment. Compared with the first embodiment, the fourth embodiment can easily function like a majority carrier device in terms of avalanche resistance and the like. Compared with the first embodiment, the fourth embodiment hardly causes current concentration, is resistive against a thermal breakdown, and is appropriate for a parallel arrangement.

Compared with the second embodiment, the diffusion region 13 of the fourth embodiment is processible in the same manufacturing process as that for the source region 4.

The semiconductor device according to the fourth embodiment can freely set a potential to start introducing positive holes from the base region 9 into the drain region 2. As a result, the fourth embodiment can secure a predetermined potential difference relative to a gate threshold potential and reserve a sufficient electron path in a channel. Namely, the fourth embodiment can reduce channel resistance and further decrease ON resistance. In a nonconductive state, the fourth embodiment can easily operate like a majority carrier device in terms of avalanche resistance and the like. The fourth embodiment hardly causes current concentration, is easily applicable to a parallel arrangement, and is resistive against a thermal breakdown. The diffusion region 13 is processible in the same manufacturing process of forming the source region 4. This simplifies manufacturing processes.

(Fifth Embodiment)

Figure 6:
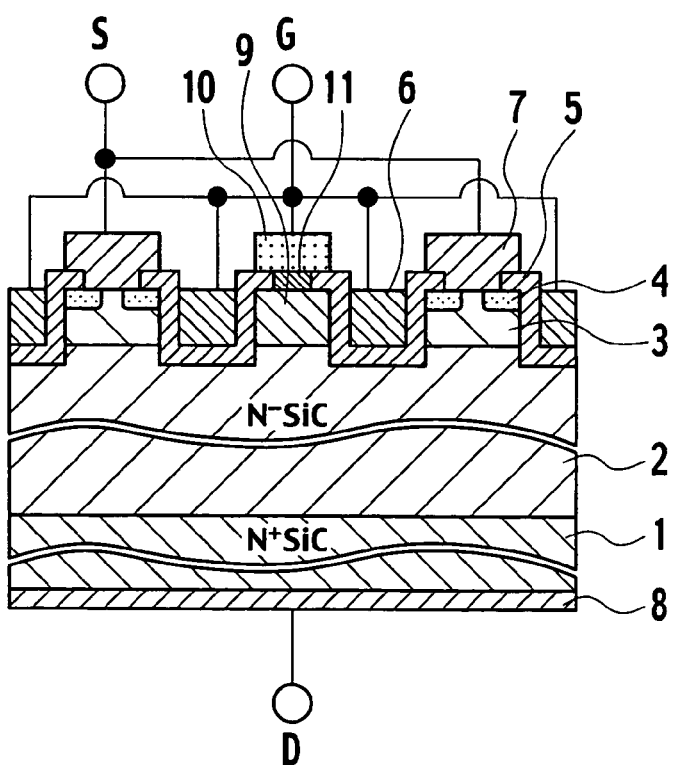
FIG. 6 is a sectional view showing a semiconductor device according to a fifth embodiment of the present invention and corresponds to FIG. 2 of the second embodiment.

FIG. 6 is a sectional view showing a semiconductor device according to a fifth embodiment of the present invention and corresponds to FIG. 2 of the second embodiment. Unlike the second embodiment having a planar structure, the fifth embodiment employs a trench structure. Parts of the fifth embodiment that operate like those of the second embodiment will not be explained again, and parts characteristic to the fifth embodiment will be explained in detail.

A principal plane of a drain region 2 opposite to a contact face between the drain region 2 and a silicon carbide substrate region 1 has trenches formed at regular intervals. In a part of the drain region 2 between adjacent trenches, there are formed a p-type well region 3 and an n$^+$-type source region 4. In each groove, a gate electrode 6 is formed. The gate electrode 6 is adjacent to the drain region 2, well region 3, and source region 4 through an insulating film 5.

The gate electrode 6 is made of conductive material such as metal or polysilicon. According to this embodiment, the gate electrode 6 is made of polysilicon. In contact with the well region 3 and source region 4, there is a source electrode 7. In contact with the silicon carbide substrate region 1, there is a drain electrode 8.

In a part of the drain region 2 between adjacent trenches, there is a p-type base region 9. The base region 9 is connected to a base electrode 10 through a Schottky region 11. The base electrode 10 is connected to the gate electrode 6. According to this embodiment, the base region 9 is connected to the base electrode 10 through the Schottky region 11. Instead, like the third embodiment, they may be connected to each other through a zener region 12 made of hetero semiconductor material, or like the fourth embodiment, they may be connected to each other through an n-type diffusion region 13. Alternatively, they may directly be connected to each other.

In FIG. 6, the base region 9 is formed to the same depth as the well region 3. Instead, the base region 9 may be shallower or deeper than the well region 3. In FIG. 6, the base electrode 10 and gate electrode 6 are connected to each other above the base region 9. Instead, they may be connected to each other at a location other than just above the base region 9.

The trench structure of FIG. 6 can improve channel density to connect the source region 4 and drain region 2 to each other. This makes it easier to integrate unit cell structures compared with the second embodiment. Operation and effect of the fifth embodiment are the same as those of the second embodiment of FIG. 2.

The semiconductor device according to the fifth embodiment can form channels along the trenches, to thereby increase channel density and easily integrate unit cell structures.

In a conductive state, the fifth embodiment introduces positive holes from the base region 9 into the drain region 2, to increase conductivity and decrease drift resistance. In a nonconductive state, the fifth embodiment can realize performance equivalent to a majority carrier device in terms of avalanche resistance and the like.

(Sixth Embodiment)

Figure 7:
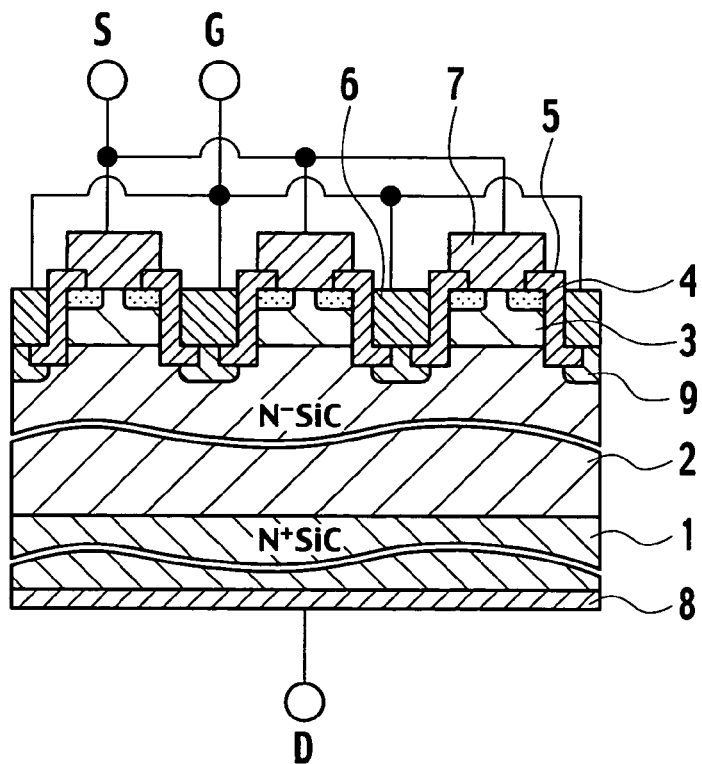
FIG. 7 is a sectional view showing a semiconductor device according to a sixth embodiment of the present invention and corresponds to FIG. 6 of the fifth embodiment.

FIG. 7 is a sectional view showing a semiconductor device according to a sixth embodiment of the present invention and corresponds to FIG. 6 of the fifth embodiment. Parts of the sixth embodiment that operate like those of the fifth embodiment will not be explained again, and parts characteristic to the sixth embodiment will be explained in detail.

In FIG. 7, the sixth embodiment forms a p-type well region 3 and an n$^+$-type source region 4 in a part of a drain region 2 between adjacent trenches. In contact with the bottom of each trench, a base region 9 is formed to contact with a gate electrode 6.

Like the modification of the third embodiment shown in FIG. 4, the sixth embodiment integrates a zener region 12 and the gate electrode 6 into one. Namely, a junction between the base region 9 and the gate electrode 6 is a heterojunction made of silicon carbide and polysilicon having different band gaps. There is an energy barrier at an interface of the heterojunction. Namely, between the p-type base region 9 and the gate electrode 6, a heterodiode is formed to pass a forward current when the p-type base region 9 is at a positive potential.

This structure needs no base region 9 to be formed in a part of the drain region 2 between adjacent trenches. Compared with the fifth embodiment, the sixth embodiment can form more source regions 4, to further increase channel density and integrate many unit cell structures.

In a nonconductive state with, for example, a ground potential or a negative potential applied to the gate electrode 6, a depletion layer grows from the base region 9 formed at the bottom of the gate electrode 6 into the drain region 2. As a result, an insulating film 5 at the bottom of a trench is subjected to substantially no drain electric field, and therefore, the insulating film 5 hardly causes an insulation breakdown. Namely, the insulation reliability of the insulating film 5 improves.

(Seventh Embodiment)

Figure 8:
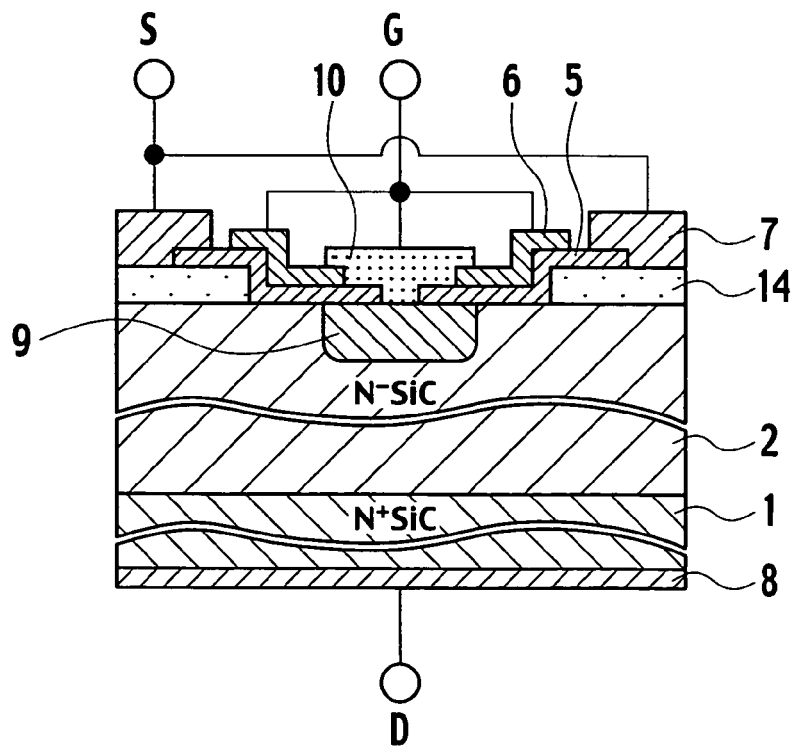
FIG. 8 is a sectional view showing a semiconductor device according to a seventh embodiment of the present invention and corresponds to FIG. 1 of the first embodiment.

FIG. 8 is a sectional view showing a semiconductor device according to a seventh embodiment of the present invention and corresponds to FIG. 1 of the first embodiment. In the sectional view of FIG. 8, two structural unit cells face each other. The semiconductor device of the seventh embodiment employs, as an example, a silicon carbide substrate.

An n$^+$-type silicon carbide substrate region 1 has a silicon carbide polytype of, for example, 4H. On the substrate region 1, an n$^-$-type drain region 2 is formed. Opposite to a contact face between the drain region 2 and the substrate region 1, a hetero semiconductor region 14 made of, for example, n⁻-type polysilicon is formed in contact with a principal plane of the drain region 2.

A junction between the drain region 2 and the hetero semiconductor region 14 is a heterojunction made of silicon carbide and polysilicon having different band gaps. At an interface of the junction, there is an energy barrier. In contact with a contact face between the hetero semiconductor region 14 and the drain region 2, there are an insulating film 5 and a gate electrode 6.

The gate electrode 6 is made of conductive material such as metal or polysilicon. According to this embodiment, the gate electrode 6 is made of polysilicon as an example. A source electrode 7 is formed in contact with the hetero semiconductor region 14. A drain electrode 8 is formed in contact with the silicon carbide substrate region 1. Apart from the hetero semiconductor region 14, a p-type base region 9 is formed in the drain region 2. The base region 9 is in contact with a base electrode 10, which is connected to the gate electrode 6. In FIG. 8, the base electrode 10 and gate electrode 6 are connected to each other above the base region 9. Instead, they may be connected to each other at a location other than above the base region 9.

According to this embodiment, the hetero semiconductor region 14 and base region 9 are not connected to each other. Instead, they may be connected to each other.

Next, operation of this embodiment will be explained. For example, the source electrode 7 is grounded and a positive potential is applied to the drain electrode 8.

First, a ground potential or a negative potential is applied to the gate electrode 6 to keep a nonconductive state. This is because the energy barrier is formed against conductive electrons at the heterojunction interface between the hetero semiconductor region 14 and the drain region 2. With reference to FIGS. 21 to 25, the characteristics of a heterojunction of polysilicon and silicon carbide will be explained in detail.

FIGS. 21 to 25 show semiconductor energy band structures. In each figure, the left side shows an n⁻-type silicon energy band structure corresponding to the hetero semiconductor region 14, and the right side shows a 4H n⁻-type silicon carbide energy band structure corresponding to the drain region 2. Although this embodiment forms the hetero semiconductor region 14 from polysilicon, the energy band structures shown in FIGS. 21 to 25 employ silicon. To clearly explain the characteristics of a heterojunction, the below-mentioned explanation is based on the energy level of an ideal semiconductor heterojunction having no interface level at a heterojunction interface.

Figure 21:
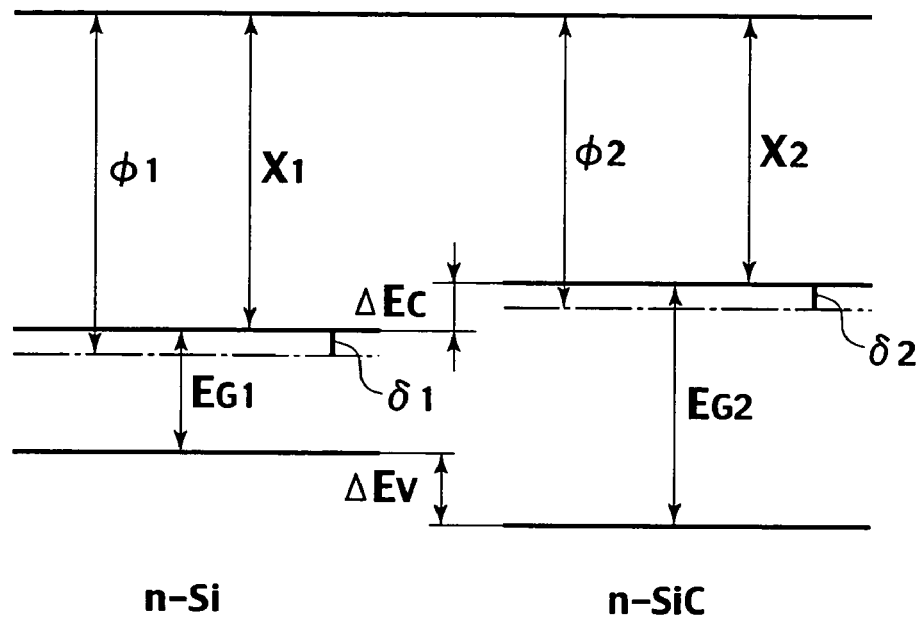
FIG. 21 shows a state in which silicon and silicon carbide are separated from each other.

FIG. 21 shows a state in which silicon and silicon carbide are separated from each other. In FIG. 21, an electron affinity of silicon is x1, a work function φ1 (energy from a vacuum level to a Fermi level), Fermi energy δ1 (energy from a conduction band to the Fermi level), and a band gap Eg1. Similarly, an electron affinity of silicon carbide is x2, a work function φ2, Fermi energy δ2, and a band gap Eg2. In FIG. 21, a junction face between silicon and silicon carbide involves an energy barrier „Ec due to an electron affinity difference between them and is expressed as follows:

$$\text{„}Ec = x1 - x2 \quad (1)$$

Figure 22:
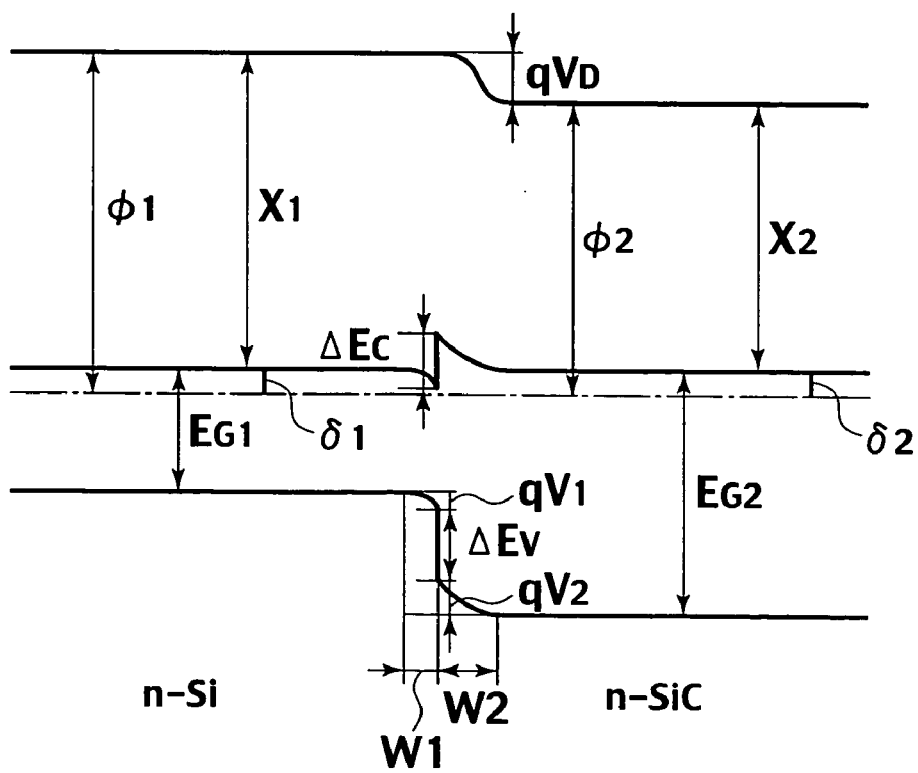
FIG. 22 shows an energy band structure with silicon and silicon carbide being in contact with each other to form a hetero-junction of silicon and silicon carbide.

FIG. 22 shows an energy band structure with silicon and silicon carbide being in contact with each other to form a heterojunction of silicon and silicon carbide. After silicon and silicon carbide are made in contact with each other, the energy barrier „Ec is present like before the contact. Accordingly, an electron accumulation layer having a width of W1 is formed at a junction interface on the silicon side. On the other hand, a junction interface on the silicon carbide side forms a depletion layer having a width of W2. A diffusion potential generated at each junction interface is VD, a diffusion potential component on the silicon side is V1, and a diffusion potential component on the silicon carbide side is V2. The diffusion potential VD is an energy difference between the Fermi levels of the junction interfaces and is expressed as follows:

$$VD = (\delta1 + \text{„}Ec - \delta2)/q \quad (2)$$

$$VD = V1 + V2 \quad (3)$$

$$W = \sqrt{\frac{2\varepsilon_0 \varepsilon_1 V_2}{q N_2}} \quad (4)$$

where ∈0 is a dielectric constant in vacuum, ∈2 is a specific dielectric constant of silicon carbide, and N2 is an ionization impurity concentration of silicon carbide. These expressions are band discontinuous models based on Anderson electron affinity in an ideal state without considering a distortion effect.

Figure 23:
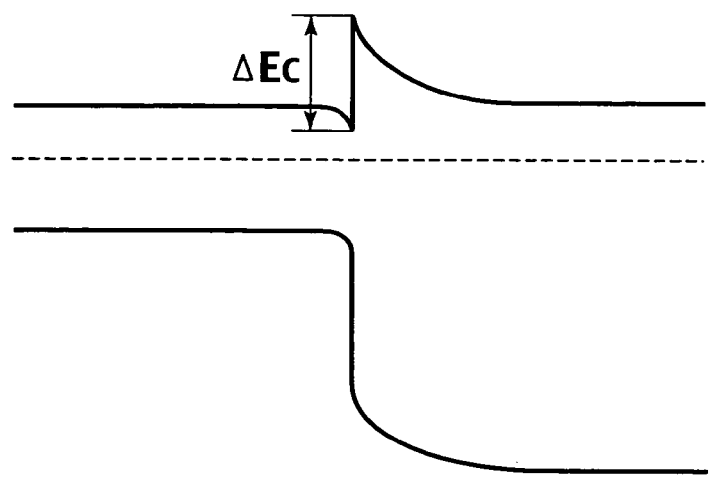
FIGS. 23 to 25 show the energy band structures at the junction interface between the hetero semiconductor region 14 and the drain region 2 of the embodiment shown in FIG. 8.
Figure 24:
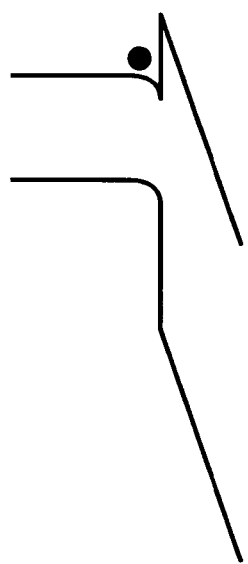
Figure 25:
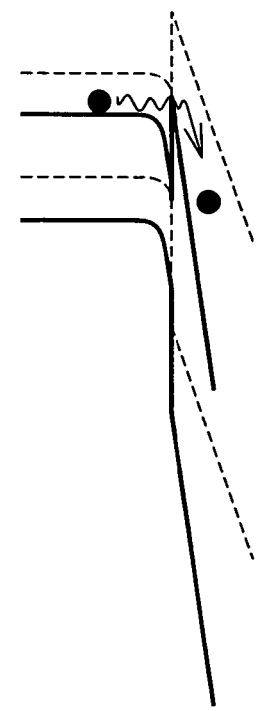

FIGS. 23 to 25 show the energy band structures at the junction interface between the hetero semiconductor region 14 and the drain region 2 of the embodiment shown in FIG. 8. In a thermally balanced state with no voltage applied to the gate electrode 6, source electrode 7, and drain electrode 8, the energy band gap structure of FIG. 24 will appear when the gate electrode 6 and source electrode 7 are set at a ground potential and a given positive potential is applied to the drain electrode 8.

In FIG. 24, a depletion layer spreads from the drain region 2 side of the heterojunction interface in response to the applied drain potential. On the other hand, conductive electrons present on the hetero semiconductor region 14 are unable to exceed the energy barrier „Ec, and the conductive electrons accumulate at the junction interface. Accordingly, electric force lines corresponding to the depletion layer spreading on the silicon carbide side terminate, and therefore, a drain electric field is shielded on the hetero semiconductor region 14 side. Even if the thickness of polysilicon forming the hetero semiconductor region 14 is very thin, for example, 20 nm, the nonconductive state is maintained. Namely, a withstand voltage is secured.

According to this embodiment, the base electrode 10 also receives the ground potential or negative potential, and therefore, the pn junction between the base region 9 and the drain region 2 is also in a reversely biased state. Then, a depletion layer spreads from the pn junction into the n⁻-type drain region 2 provided with a reduced impurity concentration to realize high resistance.

When the depletion layer extending from the base region 9 reaches an interface relative to the insulating film 5, a drain electric field reaching to the insulating film 5 is relaxed, to prevent an insulation breakdown of the insulating film 5. When the depletion layer from the base region 9 reaches the junction interface between the hetero semiconductor region 14 and the drain 2, the drain electric field reaching to the heterojunction interface is relaxed to reduce a leak current generated at the interface.

When a predetermined positive potential is applied to the gate electrode 6, the nonconductive state shifts to a conductive state. According to the embodiment, a gate threshold potential at which electrons start to flow between the hetero semiconductor region 14 and the drain region 2 is equal to or lower than a built-in potential at the pn junction formed between the base region 9 and the drain region 2. For example, if the built-in potential of the pn junction between the silicon carbide base region 9 and the drain region 2 is about 2 V, the gate threshold voltage is set to be about 2 V or smaller.

If the base region 9 and drain region 2 are made of silicon and the built-in potential of the pn junction is about 0.7 V, the gate threshold voltage is set to be 0.7 V or smaller. In this way, this embodiment can easily set the gate threshold voltage if the base region 9 and drain region 2 are made of wide-gap semiconductor such as silicon carbide.

When the positive potential applied to the gate electrode 6 reaches the gate threshold potential, the heterojunction interface between the hetero semiconductor region 14 and the drain region 2 forms a sufficient electron accumulation layer. Namely, the energy band structure of the junction interface between the hetero semiconductor region 14 and the drain region 2 to which the gate electrode 6 contacts through the insulating film 5 changes to the one depicted with a continuous line in FIG. 25. Compared with the energy band structure of the junction interface between the hetero semiconductor region 14 and the drain region 2 in the nonconductive state, the potential of the hetero semiconductor region 14 side drops, and the energy barrier on the drain region 2 side becomes steeper. As a result, electrons can tunnel the energy barrier.

Due to this, electrons blocked by the energy barrier so far flow from the source electrode 7 through the hetero semiconductor region 14 into the drain region 2, to establish a conductive state. At this time, the potential of the base region 9 is the same as that of the gate electrode 6, and therefore, the build-in electric field extended from the base region 9 to the drain region 2 and hetero junction interface retracts.

When the positive potential applied to the gate electrode 6 reaches the built-in potential of the pn junction, positive holes are introduced from the base region 9 into the drain region 2.

This results in increasing the conductivity of the drain region 2 provided with a reduced impurity concentration to realize high resistance, and therefore, electrons flowing from the hetero semiconductor region 14 into the drain region 2 receive low resistance.

When a ground potential or a negative potential is applied to the gate electrode 6, the conductive state shifts to a nonconductive state. Namely, the positive holes introduced into the drain region 2 move to the base region 9. As the positive holes in the drain region 2 are gradually depleted, the potential of the gate electrode 6 is maintained at the built-in potential between the base region 9 and the drain region 2. Namely, electrons flowing from the hetero semiconductor region 14 into the drain region 2 are maintained.

Once the positive holes introduced in the drain region 2 are depleted, the potential of the gate electrode 6 drops to the gate threshold potential, and the electron accumulation state at the heterojunction interface between the hetero semiconductor region 14 and the drain region 2 is released to stop the electron tunneling through the energy barrier. As a result, electrons from the hetero semiconductor region 14 into the drain region 2 are blocked.

In this way, this embodiment establishes a predetermined potential difference between, for example, the built-in potential of a pn junction and a gate threshold potential, so that the semiconductor device may operate as a majority carrier device just before disconnecting the hetero semiconductor region 14 and drain region 2 from each other.

Unlike a bipolar transistor representative of a minority carrier injection device, the embodiment forms a predetermined potential difference between a potential to draw positive holes and a potential to stop electrons, to thereby prevent a secondary breakdown specific to the bipolar transistor and realize the same performance as the majority carrier device in terms of avalanche resistance and the like.

In this way, this embodiment has various features. Namely, the embodiment can shorten a channel length that controls the start and stop of electrons to a length at which a heterojunction can maintain an electron stopped state, to thereby reduce channel resistance in a conductive state. The embodiment can introduce positive holes from the base region 9 into the drain region 2, to increase conductivity and decrease drift resistance. This results in further decreasing ON resistance.

In a nonconductive state, the embodiment can provide performance equivalent to a majority carrier device in terms of avalanche resistance and the like. When a depletion layer extended from the base region 9 reaches the insulating film 5, a drain electric field extended to the insulating film 5 is relaxed to improve the insulation reliability of the insulating film 5. When the depletion layer extended from the base region 9 reaches the hetero semiconductor region 14, a drain electric field extended to the hetero semiconductor region 14 is relaxed to reduce a leak current generated at the interface between the hetero semiconductor region 14 and the drain region 2.

The embodiment can shorten a channel length that controls the start and stop of electrons to a length at which a heterojunction can maintain an electron stopped state, to thereby reduce channel resistance in a conductive state. The embodiment can introduce positive holes from the base region into the drain region, to increase conductivity and decrease drift resistance. This results in further reducing ON resistance.

In a nonconductive state, the embodiment can provide performance equivalent to a majority carrier device in terms of avalanche resistance and the like. When a depletion layer extended from the base region reaches the insulating film, a drain electric field extended to the insulating film is relaxed to improve the insulation reliability of the insulating film. When the depletion layer extended from the base region reaches the hetero semiconductor region, a drain electric field extended to the hetero semiconductor region is relaxed to reduce a leak current generated at an interface between the hetero semiconductor region and the drain region.

This embodiment separates the base region 9 from the hetero semiconductor region 14, to efficiently secure positive holes introduced into the drain region 2 and improve gate driving efficiency.

According to the seventh embodiment, the gate threshold potential is set to be smaller than the built-in potential of a pn junction, to provide the above-mentioned effect. It is possible to connect an external resistor between the base electrode 10 and the gate electrode 6. In this case, positive holes are first introduced from the base region 9 into the drain region 2, and thereafter, a gate potential is further increased to pass electrons between the hetero semiconductor region 14 and the drain region 2. To secure gate driving efficiency under the application of the predetermined positive potential, a current value from the base region 9 to the drain region 2 must be one tenth or smaller of a current value between the hetero semiconductor region 14 and the drain region 2.

(Eighth Embodiment)

Figure 9:
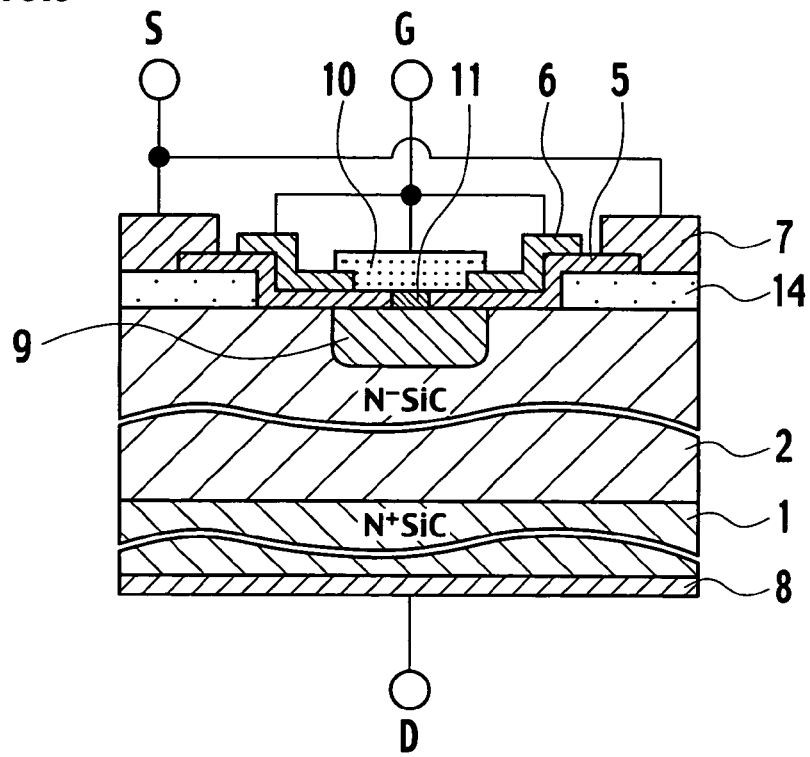
FIG. 9 is a sectional view showing a semiconductor device according to an eighth embodiment of the present invention and corresponds to FIG. 8 of the seventh embodiment.

FIG. 9 is a sectional view showing a semiconductor device according to an eighth embodiment of the present invention and corresponds to FIG. 8 of the seventh embodiment. Parts of the eighth embodiment that operate like those of the seventh embodiment will not be explained again, and parts characteristic to the eighth embodiment will be explained in detail.

In FIG. 9, a base region 9 and a base electrode 10 are connected to each other through a Schottky region 11 made of metal that forms a Schottky junction with the base region 9. Namely, between the p-type base region 9 and the Schottky region 11, a Schottky diode is formed to pass a forward current when the p-type base region 9 is at a positive potential.

Operation of the embodiment will be explained. For example, a source electrode 7 is grounded, and a positive potential is applied to a drain electrode 8.

If a ground potential or a negative potential is applied to the gate electrode 6, a nonconductive state is maintained like the seventh embodiment. Namely, a heterojunction between a hetero semiconductor region 14 and a drain region 2 is put in a reversely biased state. Also, a pn junction between the base region 9 and the drain region 2 is set in a reversely biased state although there is a potential drop corresponding to a forward built-in potential of the Schottky diode between the base region 9 and the Schottky region 11. As a result, a depletion layer expands from each junction into the n$^-$-type drain region 2 provided with a reduced impurity concentration to realize high resistance.

Next, a predetermined positive potential is applied to the gate electrode 6 to shift the nonconductive state to a conductive state. According to this embodiment, applying the predetermined positive potential to the gate electrode 6 results in applying a reverse bias to the Schottky diode formed between the base region 9 and the Schottky region 11. This means that positive holes are introduced from the base region 9 into the drain region 2 only when the sum of a built-in potential between the base region 9 and the drain region 2 and a potential to cause an avalanche breakdown between the base region 9 and the Schottky region 11 is applied to the gate electrode 6.

For example, the built-in potential between the silicon carbide base region 9 and drain region 2 is 2V, and the avalanche breakdown voltage of the Schottky diode between the base region 9 and the Schottky region 11 is 13 V. Then, a voltage to be applied to the gate electrode 6 to introduce positive holes into the drain region 2 is about 15 V.

Namely, the potential to introduce positive holes from the base region 9 into the drain region 2 can freely be set by changing the avalanche breakdown voltage of the Schottky diode formed between the base region 9 and the Schottky region 11. Compared with the seventh embodiment, the eighth embodiment can secure a sufficient difference relative to a gate threshold potential between the hetero semiconductor region 14 and the drain region 2 and form a sufficient accumulation layer at the heterojunction interface. In addition, the eighth embodiment can reduce the channel resistance of the accumulation layer to reduce ON resistance compared with the first embodiment.

Next, a ground potential or a negative potential is applied to the gate electrode 6 to shift the conductive state to a nonconductive state. According to the eighth embodiment, there is a sufficient potential difference between a potential of the gate electrode 6 at which positive holes are drawn from the drain region 2 to the base region 9 and the gate threshold potential at which the hetero semiconductor region 14 is disconnected from the drain region 2. Accordingly, the semiconductor device of the eighth embodiment operates as a majority carrier device just before the hetero semiconductor region 14 and drain region 2 are disconnected from each other.

Compared with the seventh embodiment, the eighth embodiment can easily operate like a majority carrier device in terms of avalanche resistance and the like.

As explained above, the eighth embodiment can reduce the channel resistance of an accumulation layer to further reduce ON resistance compared with the seventh embodiment. Compared with the seventh embodiment, the eighth embodiment can easily provide performance equivalent to a majority carrier device in terms of avalanche resistance and the like. Compared with the seventh embodiment, the eighth embodiment hardly causes current concentration, is resistive against a thermal breakdown, and is easily applicable to parallel connection.

(Ninth Embodiment)

Figure 10:
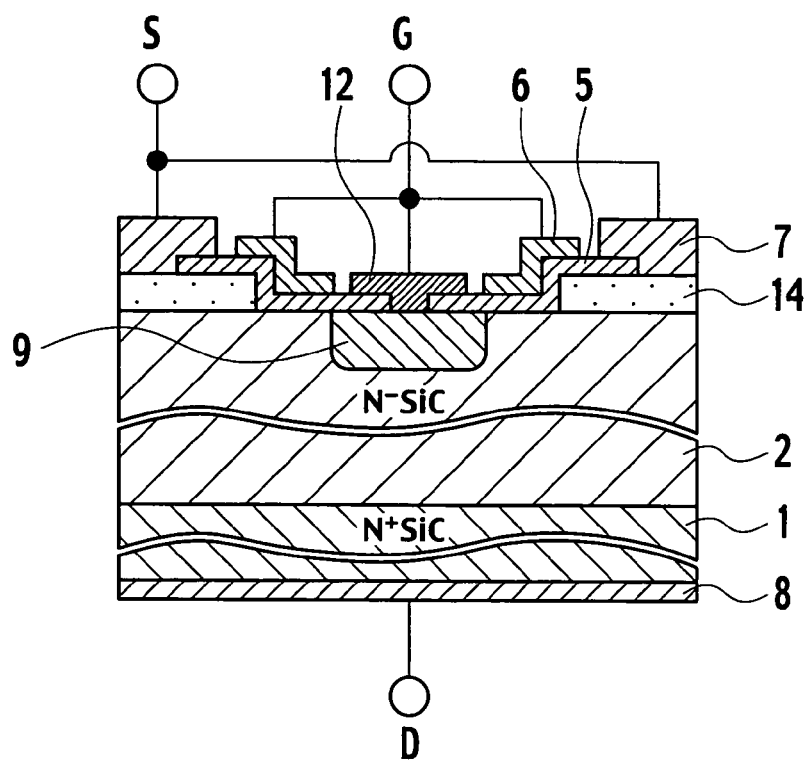
FIG. 10 is a sectional view showing a semiconductor device according to a ninth embodiment of the present invention and corresponds to FIG. 8 of the seventh embodiment.

FIG. 10 is a sectional view showing a semiconductor device according to a ninth embodiment of the present invention and corresponds to FIG. 8 of the seventh embodiment. Parts of the ninth embodiment that operate like those of the seventh embodiment will not be explained again, and parts characteristic to the ninth embodiment will be explained in detail.

In FIG. 10, the ninth embodiment forms a zener region 12 made of, for example, n-type polysilicon between a base region 9 and a base electrode 10. Namely, a junction between the base region 9 and the zener region 12 is a heterojunction of silicon carbide and polysilicon having different band gaps. At a junction interface, there is an energy barrier. Namely, between the p-type base region 9 and the zener region 12, there is formed a heterodiode to pass a forward current when the p-type base region 9 is at a positive potential.

Figure 11:
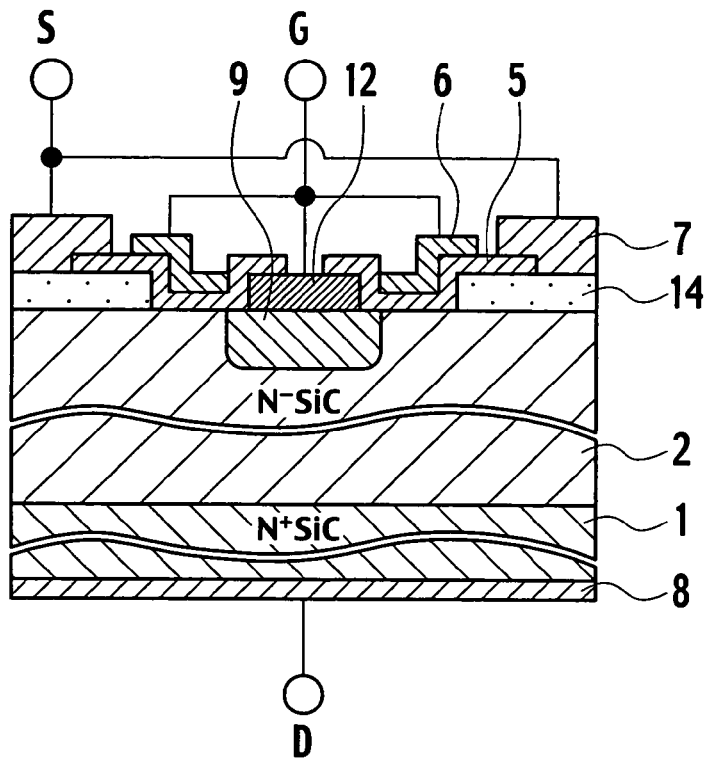
FIG. 11 is a sectional view showing a semiconductor device that is formed a zener region 12 and hetero semiconductor region 14 from similar materials according to the ninth embodiment.
Figure 12:
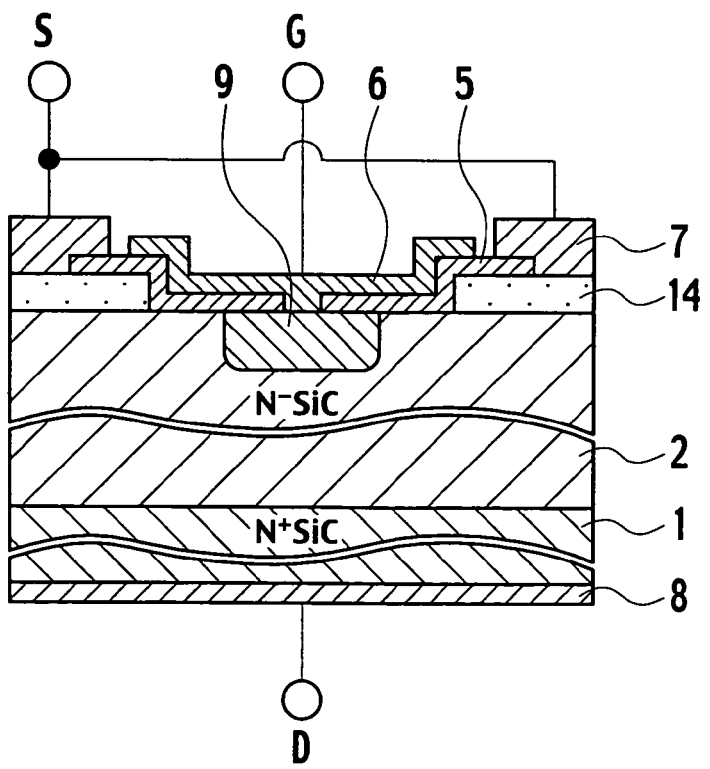
FIG. 12 is a sectional view showing a semiconductor device that is a zener region 12 and gate electrode 6 are integrated into one according to the ninth embodiment.

The ninth embodiment forms the zener region 12 and gate electrode 6 from similar materials, and therefore, the zener region 12 and gate electrode 6 can be formed in the same manufacturing process. As shown in FIG. 11, it is possible to form the zener region 12 and hetero semiconductor region 14 from similar materials. In each case, it is possible to simplify manufacturing processes. As shown in FIG. 12, the zener region 12 and gate electrode 6 may be integrated into one. In this case, there is no need of fine patterning when forming the gate electrode 6 and zener region 12.

Next, operation of the ninth embodiment will be explained. For example, the hetero semiconductor region 14 is grounded, and a positive potential is applied to a drain electrode 8.

First, a ground potential or a negative potential is applied to the gate electrode 6 to maintain a nonconductive state like the first embodiment. Namely, a heterojunction between the hetero semiconductor region 14 and a drain region 2 is set in a reversely biased state. Also, a pn junction between the base region 9 and the drain region 2 is set in a reversely biased state although there is a potential drop corresponding to a forward built-in potential of the heterodiode between the base region 9 and the zener region 12. As a result, a depletion layer expands from each junction into the n$^-$-type drain region 2 provided with a reduced impurity concentration to realize high resistance.

Next, a predetermined positive potential is applied to the gate electrode 6 to shift the nonconductive state to a conductive state. According to this embodiment, applying the predetermined positive potential to the gate electrode 6 results in applying a reverse bias to the heterodiode between the base region 9 and the zener region 12.

This means that positive holes are introduced from the base region 9 into the drain region 2 only when the sum of a built-in potential between the base region 9 and the drain region 2 and a potential to cause an avalanche breakdown between the base region 9 and the zener region 12 is applied to the gate electrode 6. For example, the built-in potential between the silicon carbide base region 9 and drain region 2 is 2V, and the avalanche breakdown voltage of the heterodiode between the base region 9 and the zener region 12 is 13 V. Then, a voltage to be applied to the gate electrode 6 to introduce positive holes into the drain region 2 is about 15 V.

Namely, the potential to introduce positive holes from the base region 9 into the drain region 2 can freely be set by changing the avalanche breakdown voltage of the heterodiode formed between the base region 9 and the zener region 12. Compared with the seventh embodiment, the ninth embodiment can secure a sufficient difference relative to a gate threshold potential between the hetero semiconductor region 14 and the drain region 2 and form a sufficient accumulation layer at a hetero interface.

Namely, the ninth embodiment can reduce channel resistance in the accumulation layer to further decrease ON resistance compared with the first embodiment.

Thereafter, a ground potential or a negative potential is applied to the gate electrode 6 to shift the conductive state to a nonconductive state. According to the ninth embodiment, there is a sufficient potential difference between a potential of the gate electrode 6 at which positive holes are drawn from the drain region 2 to the base region 9 and the gate threshold potential at which the hetero semiconductor region 14 is disconnected from the drain region 2. Accordingly, the semiconductor device of the ninth embodiment operates as a majority carrier device just before the hetero semiconductor region 14 and drain region 2 are disconnected from each other. Compared with the seventh embodiment, the ninth embodiment is capable of easily operating like a majority carrier device in terms of avalanche resistance and the like.

Compared with the seventh embodiment, the ninth embodiment can further reduce channel resistance in an accumulation layer to decrease ON resistance like the eighth embodiment. Compared with the seventh embodiment, the ninth embodiment can easily function like a majority carrier device in terms of avalanche resistance and the like. Compared with the seventh embodiment, the ninth embodiment hardly causes current concentration, is resistive against a thermal breakdown, and is appropriate for a parallel arrangement.

Compared with the seventh embodiment, the ninth embodiment forms the zener region 12 from a material similar to the material of the gate electrode 6 or the hetero semiconductor region 14, and therefore, the zener region 12, gate electrode 6, and hetero semiconductor region 14 can be formed in the same manufacturing process. The zener region 12 and gate electrode 6 can be integrated into one as shown in FIG. 12. In this case, there is no need of fine patterning when forming the gate electrode 6 and zener region 12. Compared with the eighth embodiment, the ninth embodiment can freely set the forward and reverse characteristics of the heterojunction by changing a concentration of the hetero semiconductor region 14.

(Tenth Embodiment)

Figure 13:
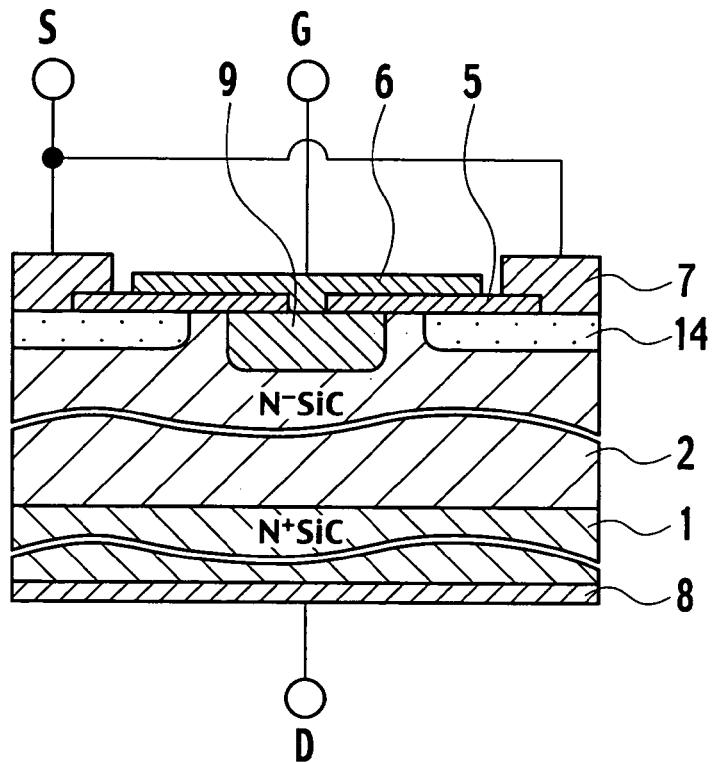
FIG. 13 is a sectional view showing a semiconductor device according to a tenth embodiment of the present invention and corresponds to FIG. 12 of the ninth embodiment.

FIG. 13 is a sectional view showing a semiconductor device according to a tenth embodiment of the present invention and corresponds to FIG. 12 of the ninth embodiment. Parts of the tenth embodiment that operate like those of the ninth embodiment will not be explained again, and parts characteristic to the tenth embodiment will be explained in detail.

In FIG. 13, the tenth embodiment embeds a hetero semiconductor region 14 in a drain region 2 and forms an insulating film 5 in a flat shape.

This configuration secures flatness at the surface where a gate electrode 6 and source electrode 7 are formed, to secure connection reliability and the like for surface mounting. The other operations and effects of the tenth embodiment are the same as those of the ninth embodiment of FIG. 12.

(Eleventh Embodiment)

Figure 14:
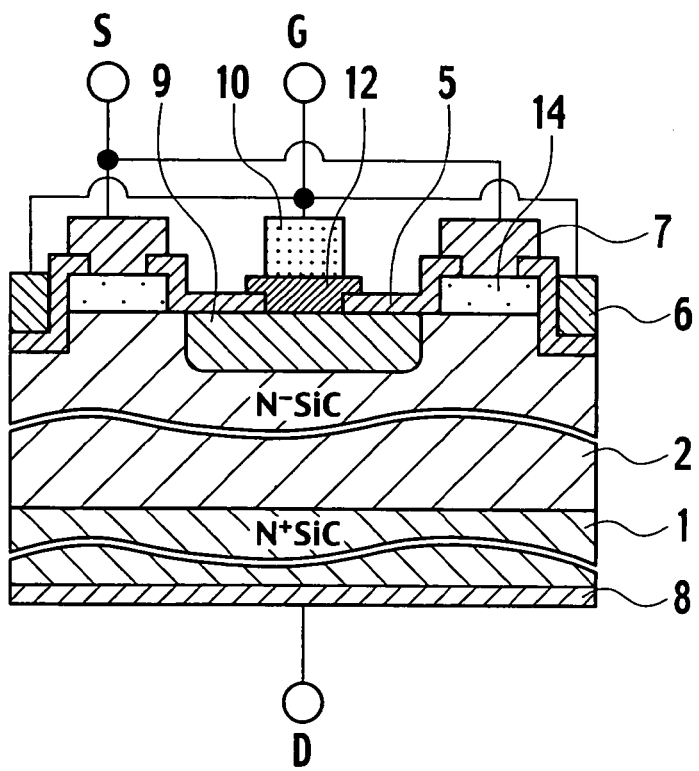
FIG. 14 is a sectional view showing a semiconductor device according to an eleventh embodiment of the present invention and corresponds to FIG. 10 of the ninth embodiment.

FIG. 14 is a sectional view showing a semiconductor device according to an eleventh embodiment of the present invention and corresponds to FIG. 10 of the ninth embodiment. Parts of the eleventh embodiment that operate like those of FIG. 10 will not be explained again, and parts characteristic to the eleventh embodiment will be explained in detail.

In FIG. 14, the eleventh embodiment employs a trench gate electrode 6 to drive a hetero interface between a hetero semiconductor region 14 and a drain region 2 that are stacked one upon another.

This configuration can increase channel density that connects the hetero semiconductor region 14 to the drain region 2. Compared with the ninth embodiment mentioned above, the eleventh embodiment can easily integrate unit cell structures. The eleventh embodiment can reduce the distance between a base region 9 and the heterojunction interface, to reduce a leak current at the time of disconnection.

(Twelfth Embodiment)

Figure 15:
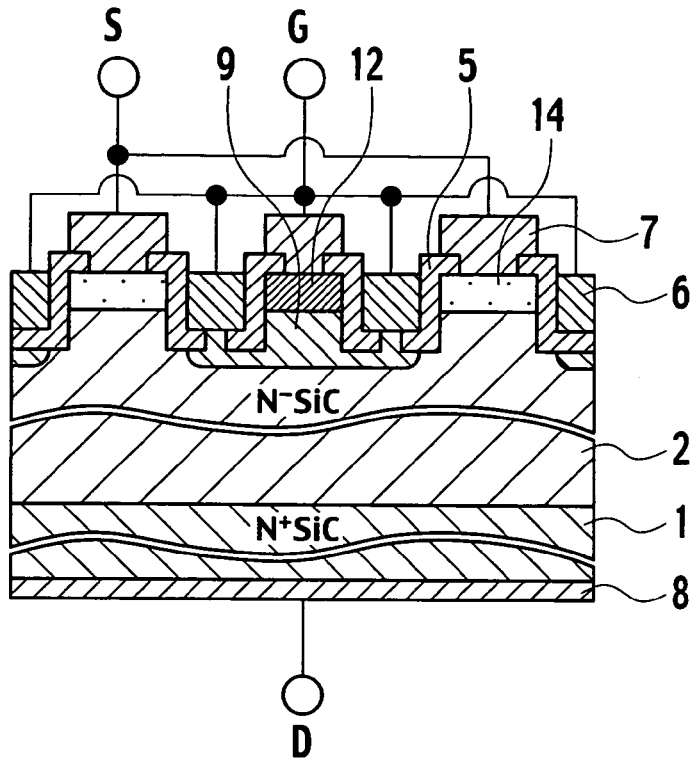
FIG. 15 is a sectional view showing a semiconductor device according to a twelfth embodiment of the present invention and corresponds to FIG. 14 of the eleventh embodiment.

FIG. 15 is a sectional view showing a semiconductor device according to a twelfth embodiment of the present invention and corresponds to FIG. 14 of the eleventh embodiment. Parts of the twelfth embodiment that operate like those of FIG. 14 will not be explained again, and parts characteristic to the twelfth embodiment will be explained in detail. In FIG. 15, the twelfth embodiment forms a gate electrode on each side of a zener region.

This configuration can increase channel density that connects a hetero semiconductor region 14 to a drain region 2. Compared with the eleventh embodiment mentioned above, the twelfth embodiment can easily integrate unit cell structures. A base region 9 is formed to cover an insulating film 5 formed at the bottom of a trench, so that a drain electric field may hardly reach the insulating film 5. This improves the insulation reliability of the insulating film 5. In a nonconductive state, a depletion layer extends from each base region 9, so that a drain electric field may hardly reach a heterojunction interface. This reduces a leak current at the time of disconnection.

(Thirteenth Embodiment)

Figure 16:
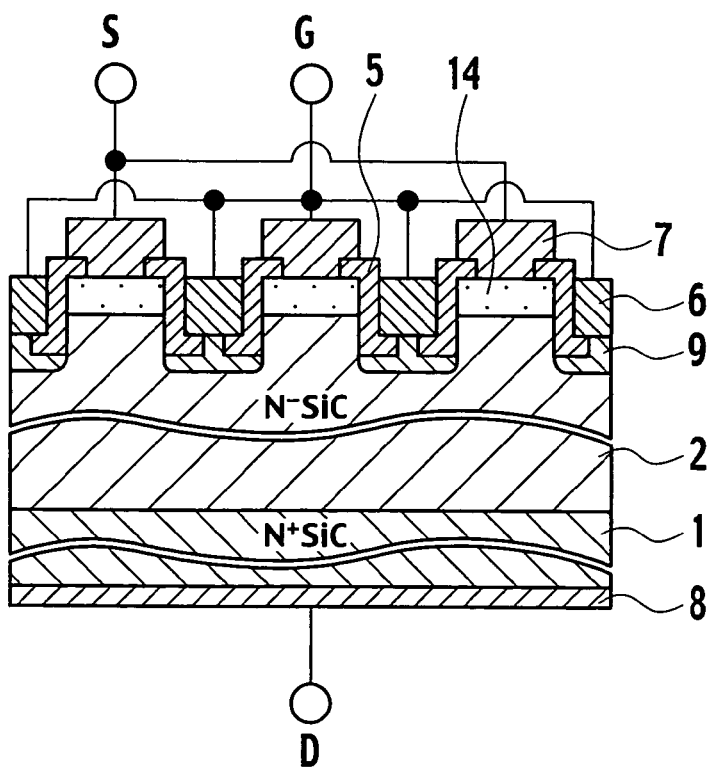
FIG. 16 is a sectional view showing a semiconductor device according to a thirteenth embodiment of the present invention and corresponds to FIG. 15 of the twelfth embodiment.

FIG. 16 is a sectional view showing a semiconductor device according to a thirteenth embodiment of the present invention and corresponds to FIG. 15 of the twelfth embodiment. Parts of the thirteenth embodiment that operate like those of FIG. 15 will not be explained again, and parts characteristic to the thirteenth embodiment will be explained in detail.

In FIG. 16, a base region 9 is formed at the bottom of a trench and is connected to a gate electrode 6.

This configuration can further increase channel density that connects a hetero semiconductor region 14 to a drain region 2. Compared with the twelfth embodiment, the thirteenth embodiment can more easily integrate unit cell structures.

(Fourteenth Embodiment)

Figure 17:
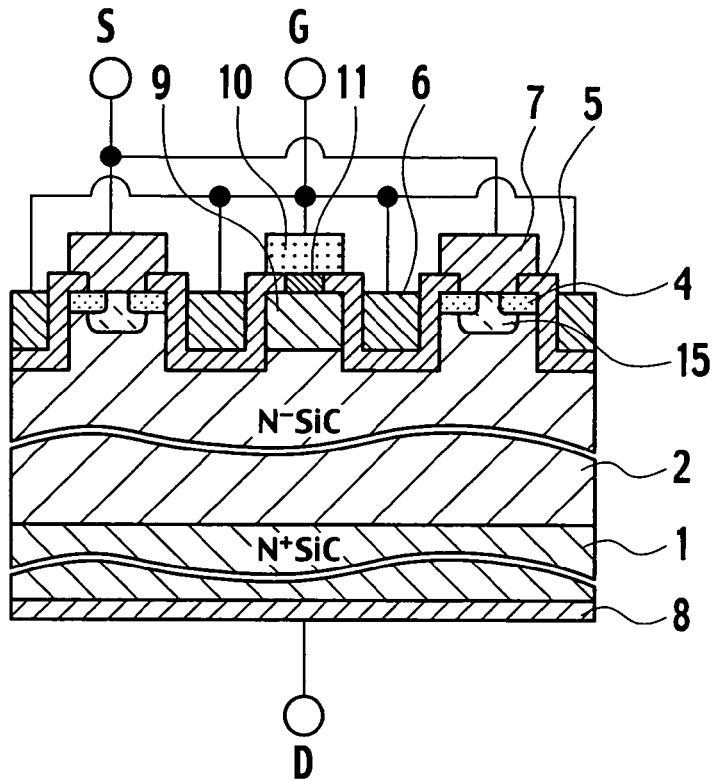
FIG. 17 is a sectional view showing a semiconductor device according to a fourteenth embodiment of the present invention.

FIG. 17 is a sectional view showing a semiconductor device according to a fourteenth embodiment of the present invention. This semiconductor device employs, for example, a silicon carbide substrate.

An n⁺-type silicon carbide substrate region 1 has a silicon carbide polytype of, for example, 4H. On the substrate region 1, an n⁻-type drain region 2 is formed. A principal plane of the drain region 2 opposite to a contact face between the drain region 2 and the silicon carbide substrate region 1 has trenches formed at regular intervals. A predetermined part of the drain region 2 between adjacent trenches has an n⁺-type source region 4 and a p-type disconnection improving region 15.

In each groove, an insulating film 5 and a gate electrode 6 are formed adjacent to the drain region 2. The gate electrode 6 is made of conductive material such as metal or polysilicon. According to this embodiment, the gate electrode 6 is made of p-type polysilicon. In contact with the source region 4 and disconnection improving region 15, there is formed a source electrode 7. In contact with the silicon carbide substrate region 1, there is formed a drain electrode 8.

Figure 18:
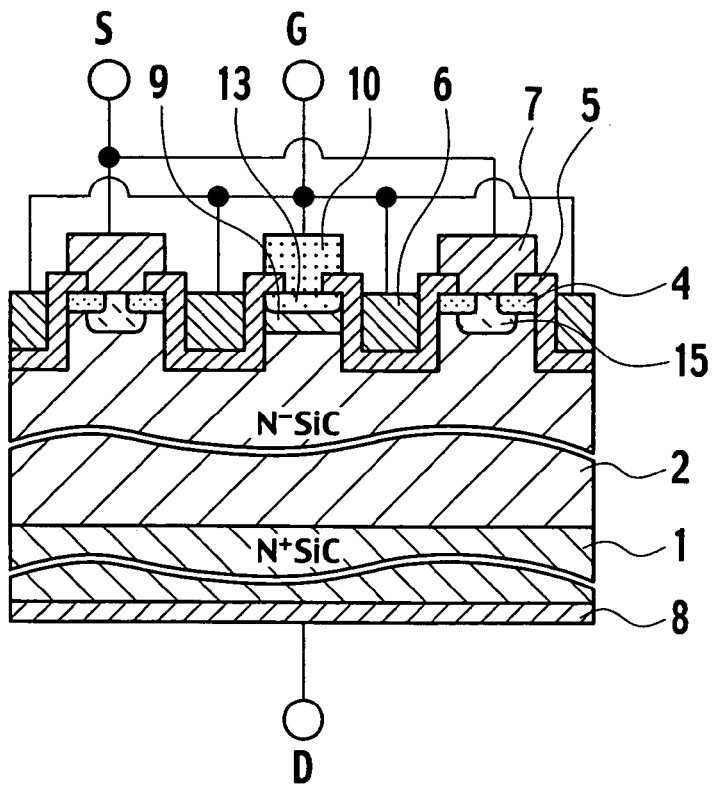
FIG. 18 is a sectional view showing a semiconductor device that a base region 9 is connected to the base electrode 10 through an n-type diffusion region 13 according to the fourteenth embodiment of the present invention.

In a part of the drain region 2 between adjacent trenches, there is formed a p-type base region 9. The base region 9 is in contact with a Schottky region 11, which is in contact with a base electrode 10. The base electrode 10 is connected to the gate electrode 6. According to this embodiment, the base region 9 is connected to the base electrode 10 through the Schottky region 11. Instead, the base region 9 may be connected to the base electrode 10 through an n-type diffusion region 13 as shown in FIG. 18. Alternatively, they may be connected to each other through a zener region 12 made of hetero semiconductor material. It is also possible to directly connect them to each other.

Next, operation of the embodiment will be explained. For example, the source electrode 7 is grounded and a positive potential is applied to the drain electrode 8.

First, a ground potential or a negative potential is applied to the gate electrode 6 to maintain a nonconductive state. Namely, a depletion layer spreads from each interface of opposing insulating films 5 along the gate electrode 6 into the drain region 2, to disconnect the source region 4 and drain region 2 from each other.

When a predetermined positive potential is applied to the gate electrode 6, the nonconductive state shifts to a conductive state. Namely, the depletion layer extended from each interface of the opposing insulating films 5 of the gate electrode 6 into the drain region 2 retracts, and electrons flow between the source region 4 and the drain region 2. When the potential applied to the gate electrode 6 reaches a built-in potential of a pn junction formed by the base region 9 and drain region 2, positive holes are introduced from the base region 9 into the drain region 2 to increase the conductivity of the drain region 2 provided with a low impurity concentration to realize high resistance. As a result, electrons flowing from the source region 4 to the drain region 2 encounter low resistance.

In this way, this embodiment can increase conductivity by introducing positive holes from the base region 9 into the drain region 2. Accordingly, the drain region 2 may have a low impurity concentration and be thin to realize a predetermined withstand voltage in a nonconductive state and maintain sufficiently low drift resistance in the drain region 2 in a conductive state. Namely, to provide the same withstand voltage as the related art, the fourteenth embodiment can further reduce drift resistance.

When a ground potential or a negative potential is applied to the gate electrode 6, the conductive state shifts to a nonconductive state. Namely, the positive holes introduced into the drain region 2 move to the base region 9. While the positive holes in the drain region 2 are being gradually depleted, the potential of the gate electrode 6 is maintained at the built-in potential of the pn junction formed between the base region 9 and the drain region 2. Namely, electrons flowing from the source region 4 into the drain region 2 are maintained. Once the positive holes introduced in the drain region 2 are depleted, the potential of the gate electrode 6 drops to a predetermined potential, and a depletion layer grows from each of the opposing insulating films 5 to establish a nonconductive state.

In this way, this embodiment establishes a predetermined potential difference between, for example, a built-in potential between the base region 9 and the drain region 2 and a gate threshold potential, so that the semiconductor device of the embodiment may operate as a majority carrier device just before the disconnection of the source region 4 from the drain region 2. Unlike a bipolar transistor representative of a minority carrier injection device, the embodiment forms a predetermined potential difference between a potential to draw positive holes and a potential to stop electrons, to thereby prevent a secondary breakdown specific to the bipolar transistor and realize the same performance as the majority carrier device in terms of avalanche resistance and the like.

In this way, the embodiment can introduce positive holes from the base region 9 into the drain region 2 in a conductive state, to increase conductivity and decrease drift resistance. In a nonconductive state, the embodiment can provide performance equivalent to a majority carrier device in terms of avalanche resistance and the like.

The fourteenth embodiment makes the gate threshold potential smaller than the built-in potential of a pn junction to provide the above-mentioned effect Instead, an external resistor may be connected between, for example, the base electrode 10 and the gate electrode 6. In this case, positive holes are first introduced from the base region 9 into the drain region 2, and when a gate potential is further increased, electrons flow between the source region 4 and the drain region 2.

To secure gate driving efficiency under the application of the predetermined positive potential, a current value from the base region 9 to the drain region 2 must be one tenth or smaller of a current value between the source region 4 and the drain region 2.

(Fifteenth Embodiment)

Figure 19:
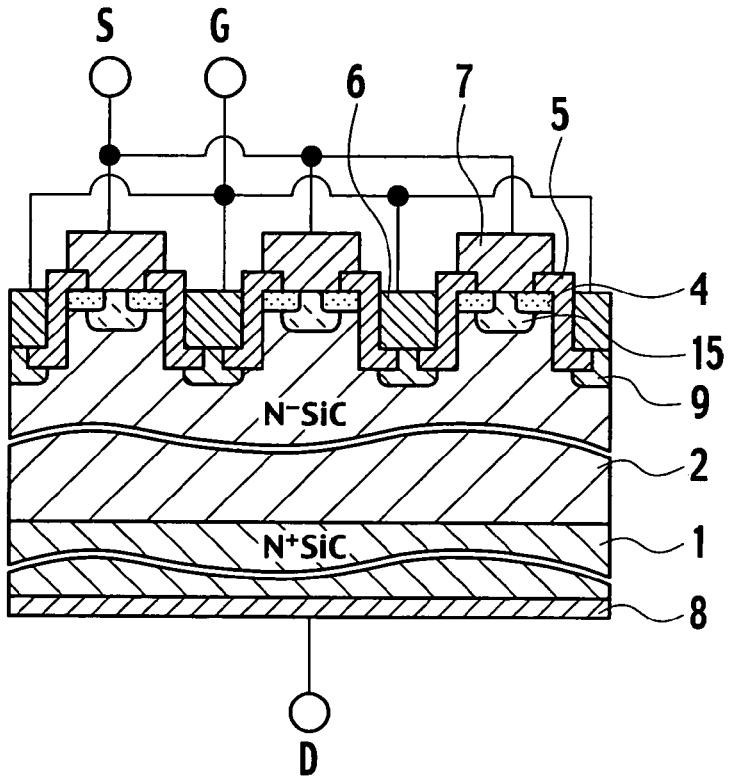
FIG. 19 is a sectional view showing a semiconductor device according to a fifteenth embodiment of the present invention and corresponds to FIG. 17 of the fourteenth embodiment.

FIG. 19 is a sectional view showing a semiconductor device according to a fifteenth embodiment of the present invention and corresponds to FIG. 17 of the fourteenth embodiment. Parts of the fifteenth embodiment that operate like those of FIG. 17 will not be explained again, and parts characteristic to the fifteenth embodiment will be explained in detail.

In FIG. 19, the fifteenth embodiment forms a base region 9 at the bottom of a trench and connects the base region 9 to a gate electrode 6.

This configuration can increase channel density connecting a source region 4 to a drain region 2. Compared with the fourteenth embodiment, the fifteenth embodiment can more easily integrate unit cell structures. The base region 9 is formed to cover an insulating film 5 at the bottom of each trench, to prevent a drain electric field from reaching the insulating film 5. This improves the insulation reliability of the insulating film 5. In a nonconductive state, a depletion layer grows from the base region 9, to prevent a drain electric field from reaching a part of the drain region 2 between adjacent gate electrodes 6. This improves the disconnection ability of the semiconductor device.

According to the first to fifteenth embodiments, each semiconductor device employs a silicon carbide substrate. Instead, the substrate may be made of any other semiconductor material such as silicon, silicon germane, gallium nitride, or diamond. Each of the embodiments has employed a silicon carbide polytype of 4H. The present invention can employ any other silicon carbide polytype such as 6H and 3C.

According to the embodiments, the drain electrode 8 and source electrode 7 are faced to each other with the drain region 2 interposed between them and a drain current is vertically passed to form an insulated gate transistor having a vertical structure. Instead, the drain electrode 8 and source electrode 7 may be arranged on the same principal plane to horizontally pass a drain current and form an insulated gate transistor having a horizontal structure. According to the embodiments mentioned above, the drain region 2 and source region 4 have a conductivity type of "n" and majority carriers are electrons. Instead, the drain region 2 and source region 4 may have a conductivity type of "p" and majority carriers are positive holes.

According to the first to sixth embodiments, the drain region 2 and source region 4 are separated from each other to form an inversion semiconductor device. Instead, the drain region 2 and source region 4 may have the same conductivity type (n) and are connected to each other to form an accumulation semiconductor device.

According to the seventh to thirteenth embodiments, the hetero semiconductor region 14 employs polysilicon as hetero semiconductor. Instead, the present invention can employ any material that forms a heterojunction with silicon carbide. According to the seventh to thirteenth embodiments, the drain region 2 is made of n-type silicon carbide and the source region 4 n-type polysilicon. Instead, the present invention can employ any combination selected from an n-type silicon carbide and p-type polysilicon combination, a p-type silicon carbide and p-type polysilicon combination, and a p-type silicon carbide and n-type polysilicon combination.

The entire content of Japanese Patent Application No. 2003-171095 filed on Jun. 16$^{th}$, 2003 is hereby incorporated by reference.

Although the invention has been described above by reference to certain embodiments of the invention, the invention is not limited to the embodiments described above. Modifications and variations of the embodiments described above will occur to those skilled in the art, in light of the teachings. The scope of the invention is defined with reference to the following claims.

What is claimed is:

1. A semiconductor device comprising:
   a drain region of a first conductivity type formed in a semiconductor substrate;
   a source region of the first conductivity type;
   an insulating film in contact with the drain region and the source region;
   a gate electrode insulated from the drain region and the source region by the insulating film; and
   a base region of a second conductivity type electrically connected to the gate electrode and in contact with the drain region,
   wherein majority carriers flow between the source region and the drain region before minority carriers are injected from the base region into the drain region when a predetermined potential is applied to the gate electrode.

2. The semiconductor device of claim 1, further comprising:
   a well region of the second conductivity type, the well region being in contact with the drain region of the first conductivity type and the source region of the first conductivity type and being separated from the base region.

3. The semiconductor device of claim 2, wherein the depth of the base region is equivalent to the depth of the well region.

4. The semiconductor device of claim 1, wherein:
   the source region is in contact with the drain region and is a hetero semiconductor region having a different band gap from the drain region; and
   the gate electrode is arranged at a junction between the source region and the drain region through the insulating film.

5. The semiconductor device of claim 4, wherein:
   the base region is not in contact with the source region.

6. The semiconductor device of claim 1, wherein:
   the base region is in contact with the insulating film.

7. The semiconductor device of claim 1, further comprising:
   trenches formed at predetermined intervals in one face of the drain region,
   the insulating film formed in the trenches,
   the gate electrode formed on the insulating film,
   the source region in contact with the one face of the drain region between adjacent trenches.

8. The semiconductor device of claim 7, wherein:
   the base region is in contact with the bottom of a corresponding one of the trenches.

9. The semiconductor device of claim 7, wherein:
   the source region is made of hetero semiconductor material.

10. The semiconductor device of claim 7, further comprising:
    a disconnection improving region of the second conductivity type arranged in contact with the source region.

11. The semiconductor device of claim 1, further comprising:
    a Schottky region arranged between the base region and the gate electrode, and forming a Schottky diode with the base region.

12. The semiconductor device of claim 1, further comprising:
    a zener region formed on one face of the drain region, made of hetero semiconductor material, and forming a heterodiode with the base region.

13. The semiconductor device of claim 12, wherein:
    the zener region is integral with the gate electrode.

14. The semiconductor device of claim 12, wherein:
    the zener region is made of the same material as the gate electrode or the hetero semiconductor region.

15. The semiconductor device of claim 1, further comprising:
    a diffusion region of the first conductivity type arranged in contact with the base region and gate electrode and separated from the drain region.

16. The semiconductor device of claim 1, wherein:
    the semiconductor substrate is made of wide-gap semiconductor.

17. The semiconductor device of claim 16, wherein:
the hetero semiconductor region is made of at least one selected from the group consisting of monosilicon, polysilicon, and amorphous silicon.

18. The semiconductor device of claim 1, wherein:
when a predetermined potential is applied to the gate electrode, the value of a current flowing from the base region to the drain region is one tenth or smaller of the value of a current flowing between the source region and the drain region.

19. The semiconductor device of claim 2, wherein:
when a predetermined potential is applied to the gate electrode, the value of a current flowing from the base region to the drain region is one tenth or smaller of the value of a current flowing between the source region and the drain region.

20. The semiconductor device of claim 4, wherein:
when a predetermined potential is applied to the gate electrode, the value of a current flowing from the base region to the drain region is one tenth or smaller of the value of a current flowing between the source region and the drain region.

21. The semiconductor device of claim 7, wherein:
when a predetermined potential is applied to the gate electrode, the value of a current flowing from the base region to the drain region is one tenth or smaller of the value of a current flowing between the source region and the drain region.

* * * * *